United States Patent
Ravi et al.

(10) Patent No.: US 12,205,673 B1
(45) Date of Patent: Jan. 21, 2025

(54) READ DATA STROBE PATH HAVING VARIATION COMPENSATION AND DELAY LINES

(71) Applicant: Cadence Design Systems, Inc., San Jose, CA (US)

(72) Inventors: Hari Anand Ravi, Bengaluru (IN); Sachin Ramesh Gugwad, Bengaluru (IN); Jitendra Kumar Yadav, Bengaluru (IN); Thomas Evan Wilson, Laurel, MD (US); Vinod Kumar, Pratapgarh (IN)

(73) Assignee: Cadence Design Systems, Inc., San Jose, CA (US)

( * ) Notice: Subject to any disclaimer, the term of this patent is extended or adjusted under 35 U.S.C. 154(b) by 264 days.

(21) Appl. No.: 17/945,902

(22) Filed: Sep. 15, 2022

(51) Int. Cl.
| | |
|---|---|
| *G11C 8/18* | (2006.01) |
| *G06F 1/12* | (2006.01) |
| *G06F 13/20* | (2006.01) |
| *G11C 7/22* | (2006.01) |

(52) U.S. Cl.
CPC ............... *G11C 8/18* (2013.01); *G06F 1/12* (2013.01); *G06F 13/20* (2013.01); *G11C 7/222* (2013.01)

(58) Field of Classification Search
CPC ........................................................ G11C 8/18
See application file for complete search history.

(56) References Cited

U.S. PATENT DOCUMENTS

| 12,051,481 B1* | 7/2024 | Lin | G11C 7/1003 |
|---|---|---|---|
| 2002/0091958 A1* | 7/2002 | Schoenfeld | G06F 1/10 |
| | | | 713/401 |
| 2006/0087894 A1* | 4/2006 | Kim | G11C 7/1066 |
| | | | 365/189.02 |
| 2012/0194248 A1* | 8/2012 | Magee | G11C 7/04 |
| | | | 327/262 |
| 2021/0405684 A1* | 12/2021 | Ware | G11C 7/04 |
| 2022/0358061 A1* | 11/2022 | Siliveri | G06F 13/1673 |
| 2022/0407674 A1* | 12/2022 | Bhakta | H04L 7/0004 |

* cited by examiner

*Primary Examiner* — Douglas King
(74) *Attorney, Agent, or Firm* — Schwegman Lundberg & Woessner, P.A.

(57) ABSTRACT

Various embodiments described herein provide for a read data strobe (RDQS) path having variation compensation (e.g., voltage and temperature compensation), delay lines, or both, where the RDQS path can be included by a physical (PHY) interface for a memory device, such as a Double Data Rate (DDR) Dynamic Random-Access Memory (DRAM) memory device.

20 Claims, 14 Drawing Sheets

READ DATA STROBE PATH HAVING VARIATION COMPENSATION AND DELAY LINES

TECHNICAL FIELD

Embodiments described herein relate to memory and, more particularly, a read data strobe (RDQS) path having variation compensation (e.g., voltage and temperature compensation), delay lines, or both, where the RDQS path can be included by a physical (PHY) interface for a memory device.

BACKGROUND

Certain memory systems, such as ones that use DDR Dynamic Random-Access Memory (DRAM) devices, include a physical (PHY) interface that enables a memory controller to interface with the memory device and that converts data signals and commands from the memory controller into signals that the memory device can process. The PHY interface can comprise one or more data (DQ) paths that couple to one or more DQ pins of the DDR memory device and transfers data (e.g., 8-bit data words) to and from the DDR memory device, and a DQ strobe (DQS) path that couples to a DQS pin of the DDR memory device and facilities a read operation on DDR memory device.

BRIEF DESCRIPTION OF THE DRAWINGS

Various ones of the appended drawings merely illustrate example embodiments of the present disclosure and should not be considered as limiting its scope.

DETAILED DESCRIPTION

Figure 1:
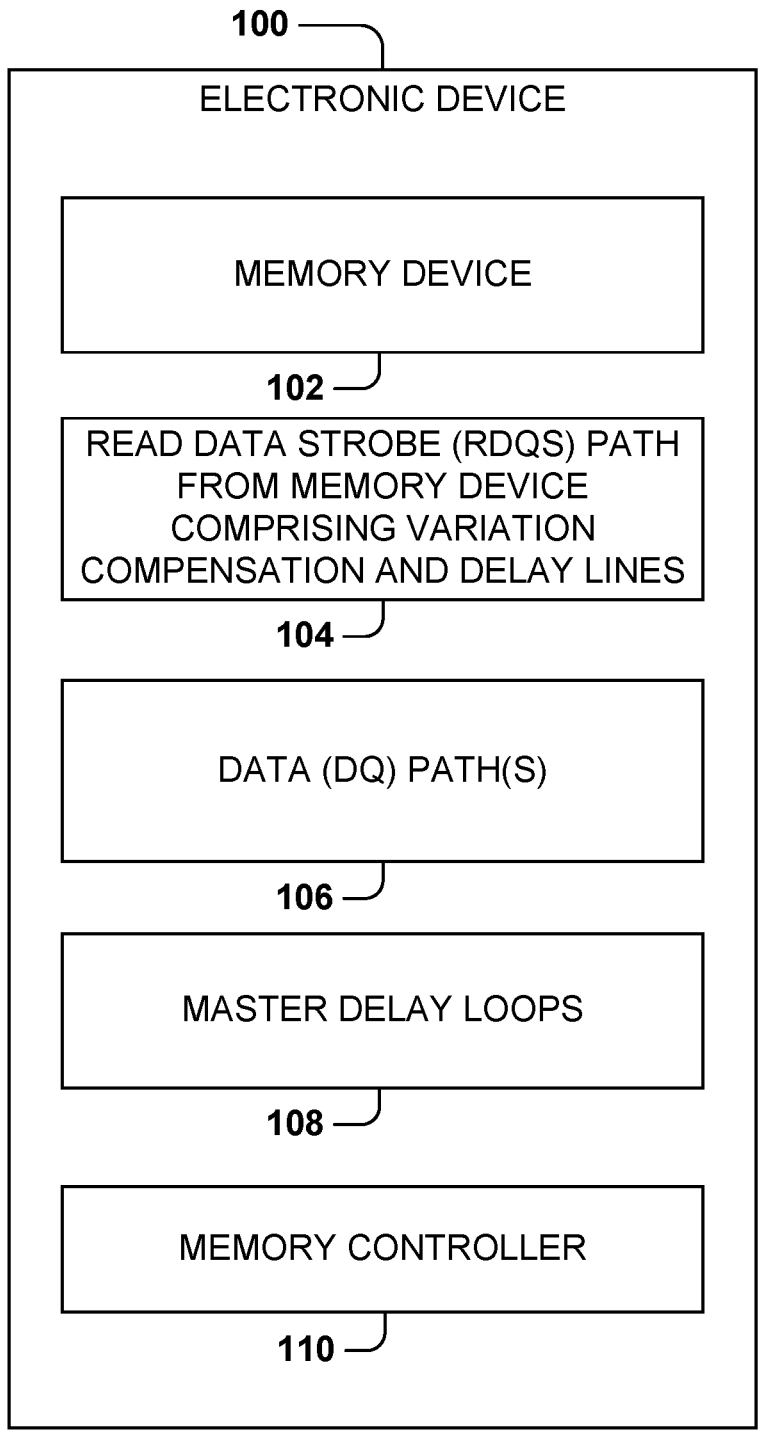
FIG. 1 is a block diagram illustrating an example electronic device that comprises an example read data strobe (RDQS) path from a memory device comprising variation compensation and delay lines from a memory device, in accordance with various embodiments.

Various embodiments described herein provide for a read data strobe (RDQS) path having variation compensation (e.g., voltage and temperature compensation), delay lines, or both, where the RDQS path can be included by a physical (PHY) interface for a memory device, such as a Double Data Rate (DDR) Dynamic Random-Access Memory (DRAM) memory device.

Generally, there is a DQ path and a DQ pin for each bit of data (e.g., each bit of a data word) to be transferred during a read operation or a write operation on the DDR memory device. Additionally, during a read operation or a write operation, the DQS path provides a DQ strobe (DQS) signal that operates as a clock signal for synchronizing and sampling read and write data (e.g., read and write data bits) conveyed (e.g., provided) over one or more DQ paths. With respect to a DDR memory device, two data bits (e.g., of a data word) are transferred over each DQ path per a cycle of a DQS signal transmitted over a DQS path-one data bit transferred on a positive edge of the DQS signal and another data bit is transferred on a negative edge of the DQS signal. Some memory systems have a DQS path for read operations (read DQS (RDQS) path) and a separate DQS path for write operations (write DQS (WDQS) path). To achieve reliable data transfer, signals (such as DQS signals) for read/write operations in a DDR-based memory system adhere to strict timing requirements. Usually, this adherence becomes more difficult as the operating frequency of the DDR-based memory device increases (e.g., due to the data line skew, duty cycle distortion, jitter, and the like).

Various embodiments described herein reduce power, reduce circuit area, improve timing margins, or some combination thereof of a read data path coupled to a memory device, such as a read data path of a PHY interface in a DDR memory system (e.g., Low Power (LP) DDRx memory system, such as a LPDDR5 memory system). In particular, a read data path architecture of some embodiments comprises a read DQS (RDQS) path, and one or more logic blocks, logic gates, and delay line components in the RDQS path can be compensated (e.g., voltage and temperature (VT) compensated) for effects (e.g., VT drift) caused to by a voltage or a temperature variation. In this way, various embodiments can improve power, performance, or area (PPA) for the read data path coupled to a memory device.

For some embodiments, a RDQS path comprises a base delay line component, adder delay line components, rise delay line components, and fall delay line components. In this way, various embodiments, delay line components in a RDQS path are split (e.g., divided) into a hierarchy/architecture of delay line components (e.g., four levels of delay line components) that does not currently exist in conventional RDQS path. The delay line components of the RDQS path can be used to adjust (e.g., position) read data strobe (RDQS) signals provided (e.g., conveyed) by the RDQS path at the center of data bits carried by data signals provided (e.g., conveyed) by data paths (e.g., DQ paths). For some embodiments, the base delay line component is used to provide skew between data signal provided by data paths (e.g., DQ paths) and a read data strobe signal (RDQS signal) provided by the RDQS path, which is a common delay in the RDQS path for all data paths (e.g., all data signals carrying data bits); each adder data line component is used to provide de-skewing per a data path (e.g., per a DQ path); and each rise delay line component and fall delay line component is used to compensate for duty cycle distortion (DCD) by creating offset between rise and fall edges of data strobe signals provided by the RDQS path. Additionally, some embodiments provide for a process (e.g., algorithm) for training a base delay line component, adder delay line components, rise delay line components, and fall delay line components of a RDQS path described herein.

By use of various embodiments, data paths (e.g., DQ paths) of a memory system can avoid replication of logic gates and logic blocks (e.g., combinatorial logic) of the RDQS path in each of the data paths (e.g., in each DQ path), which conventional memory systems may do for purposes of tracking delay drifts caused by voltage and temperature variations (e.g., keeping the phase of data signals on each DQ path relative to read data strobe signals on the RDQS path the same after VT drift). Further, the use of single adder delay line component for a pair of rise and fall delay line components in the RDQS path can enable the rise and fall delay line components to leverage the delay range of the single adder delay line component so that the rise and fall delay line components can support a smaller range of delays (and delay codes) than otherwise possible. In this way, various embodiments can save power and area with respect to the rise and fall delay line components.

Some embodiments use at least two master delay loops (MDLs), each comprising a master delay line component, to facilitate compensation for effects caused to circuit elements (e.g., increased signal delay) by a voltage or a temperature variation. For instance, a first MDL (or first MDL subcircuit) comprising a first master delay line component (also referred to herein as "MW") and a first phase detector can be used to determine (e.g., obtain) VT drift information of one or more delay elements included by the RDQS path based on a code of the first master delay line component (also referred to as MW code) that controls a delay applied by the first master delay line component in the first MDL. A second MDL (or second MDL sub-circuit) comprising a second master delay line component (also referred to herein as "MR"), a network of components modeling one or more logic gates or logic blocks included by the RDQS path, and a second phase detector can be used to determine (e.g., obtain) VT drift information of one or more delay elements included by the RDQS path and VT drift information of the one or more logic gates or logic blocks. According to some embodiments, the first phase detector is operatively coupled to the output of the first master delay line component, and the MW code is updated (e.g., adjusted) such that a phase difference (as determined by the first phase detector) between a clock signal and an output signal of the first master delay line component is maintained at a predetermined value, such as three-hundred sixty degrees or $2\pi$ radians. Additionally, for some embodiments, the second phase detector is operatively coupled to the output of the network of components, the network of components is operatively coupled to the output of the second master delay line component, and the MR code is updated (e.g., adjusted) such that a phase difference (as determined by the second phase detector) between a clock signal and an output signal of the network of components is maintained at a predetermined value, such as three-hundred sixty degrees or $2\pi$ radians. In particular, some embodiments compensate for an increase of delay in the network of components (of the second MDL) after the VT drift by adjusting the MR code to decrease the delay applied by the second master delay line component (e.g., by decreasing the MR code), and compensate for a decrease of delay in the network of components (of the second MDL) after the VT drift by adjusting the MR code to increase the delay applied by the second master delay line component (e.g., by increasing the MR code). The first master delay loop and the second master delay loop can operate in parallel. For some embodiments, VT drift information of the one or more delay elements included by the RDQS path can be determined based on the MW code, and VT drift information of the one or more logic gates or logic blocks included by the RDQS path can be determined by subtracting the MR code from MW code (e.g., at initialization and after VT drift). The determined VT drift information of the one or more delay elements and the VT drift information of the one or more logic gates or logic blocks can be used to update (e.g., adjust) the codes of the base delay line component, the adder delay line components, the rise delay line components, and the fall delay line components of the RDQS path. In this way, the total delay in the RDQS path can be maintained at a constant after VT drift.

As used herein, a delay line component can apply a delay (e.g., of a determined amount) to a signal passing through the delay line component, where the amount of delay applied is based on a code (e.g., delay line code) that is received as input by the delay line component. For instance, different values of the code can correspond to different amounts of delay. The delay line component can comprise a digital delay line (DDL) component, which can generate a delayed signal based on an input signal and one or more settings (e.g., delay values) applied to the digital delay line component.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a block diagram illustrating an example electronic device 100 that comprises an example read data strobe (RDQS) path from a memory device comprising variation compensation and delay lines 104 (hereafter, the RDQS path 104) from a memory device 102, in accordance with various embodiments. The electronic device 100 may comprise any electronic device that uses a memory and a processor, such as a central processor unit (CPU) or a graphics processing unit (GPU). For instance, the electronic device 100 may comprise, without limitation, a computer (e.g., a server computer, a client computer, a personal computer (PC), a tablet computer, a laptop computer, a netbook), a set-top box (STB), a personal digital assistant (PDA), an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any electronic device capable of executing instructions with respect to a memory.

As shown, the electronic device 100 includes a memory device 102, the RDQS path 104 coupled to the memory device 102, one or more data (DQ) paths 106 coupled to the memory device 102, a master delay loops 108, and a memory controller 110. According to various embodiments, the RDQS path 104 comprises a base delay line component, adder delay line components, rise delay line components, and fall delay line components as described herein. Additionally, for some embodiments, the master delay loops 108 comprises at least two master delay loops that are used to determine information (e.g., VT drift information) for the RDQS path 104 and to update (e.g., adjust) codes of one or more delay line components of the RDQS path 104. Any one or more of the components described may be implemented using hardware alone or a combination of hardware and software. Moreover, any two or more components of the electronic device 100 may be combined into a single component, and the functions described herein for a single component may be subdivided among multiple components.

To avoid obscuring illustrated embodiments with unnecessary detail, various functional components (e.g., modules) that are not germane to conveying an understanding of the illustrated embodiments may have been omitted from the figures described herein. Various additional functional components may be supported by the electronic device 100 to facilitate additional functionality that is not specifically described herein.

The memory device 102 comprises one or more memory cells or memory devices, each of which may comprise some form of random access memory (RAM), such as Dynamic Random-Access Memory (DRAM) or Static Random-Access Memory (SRAM). Though illustrated as a separate component, for some embodiments, the RDQS path 104 and the one or more DQ paths 106 can form part of the memory device 102. For some embodiments, the memory device 102 comprises DDR Dynamic Random-Access Memory (DRAM), such as Double Data Rate 3 (DDR3), Double Data Rate 4 (DDR4), Low Power Double Data Rate 3 (LPDDR3), and Low Power Double Data Rate 4 (LPDDR4), and Low Power Double Data Rate 5 (LPDDR5).

Though not illustrated, the electronic device 100 includes a PHY, which can comprise one or more electronic signal paths (e.g., individual lines coupling pins of the memory device 102 and the memory controller 110) such that data, address, command, protocol, control, clock, and other information can be carried between the memory device 102 and the memory controller 110 as electronic signals. The PHY can comprise an interconnect, such as a link or a bus. Among the electronic signals carried, the PHY can carry one or more data signals for data to be written to, or read from, the memory device 102 (e.g., a memory cell of the memory device 102). Additionally, the PHY can carry one or more signals, which can facilitate writing data to, or reading data from, the memory device 102 (e.g., a memory cell of the memory device 102). The PHY can further comprise a memory socket, such as a SIMM or DIMM socket, configured to connect to a particular memory module package. For some embodiments, at least one of the RDQS path 104 and the one or more DQ paths 106 forms part of the PHY.

The memory controller 110 manages exchange of data to and from the memory device 102. To facilitate this, the memory controller 110 can exchange data, address, command, protocol, control, clock, and other information with the memory device 102 over various paths, including the RDQS path 104 or the one or more DQ paths 106. For some embodiments, the RDQS path 104 and the one or more DQ paths 106 facilitate exchange of data to be read from the memory device 102.

For various embodiments, the RDQS path 104 and the one or more DQ paths 106 couple the memory controller 110 to the memory device 102. The one or more DQ paths 106 can provide (e.g., convey) one or more data signals that carry data bits to be written to the memory device 102 for storage, and can provide (e.g., convey) one or more data signals that carry data bits read from the memory device 102. For some embodiments, the RDQS path 104 provide (e.g., convey) data strobe signals for sampling the data bits from the data signals provided by the one or more DQ paths 106. For some embodiments, such as where the memory device 102 comprises one or more DDR memory devices, a given data signal on an individual data path (of the one or more DQ paths 106) can carry two data bits per clock cycle to or from the memory device 102, where a data strobe signal provided (e.g., conveyed) by the DQS path (e.g., RDQS path 104) can be generated based on the clock cycle.

More regarding some embodiments of the RDQS path 104 and the one or more DQ paths 106 is described below with respect to the other figures described herein.

Figure 2:
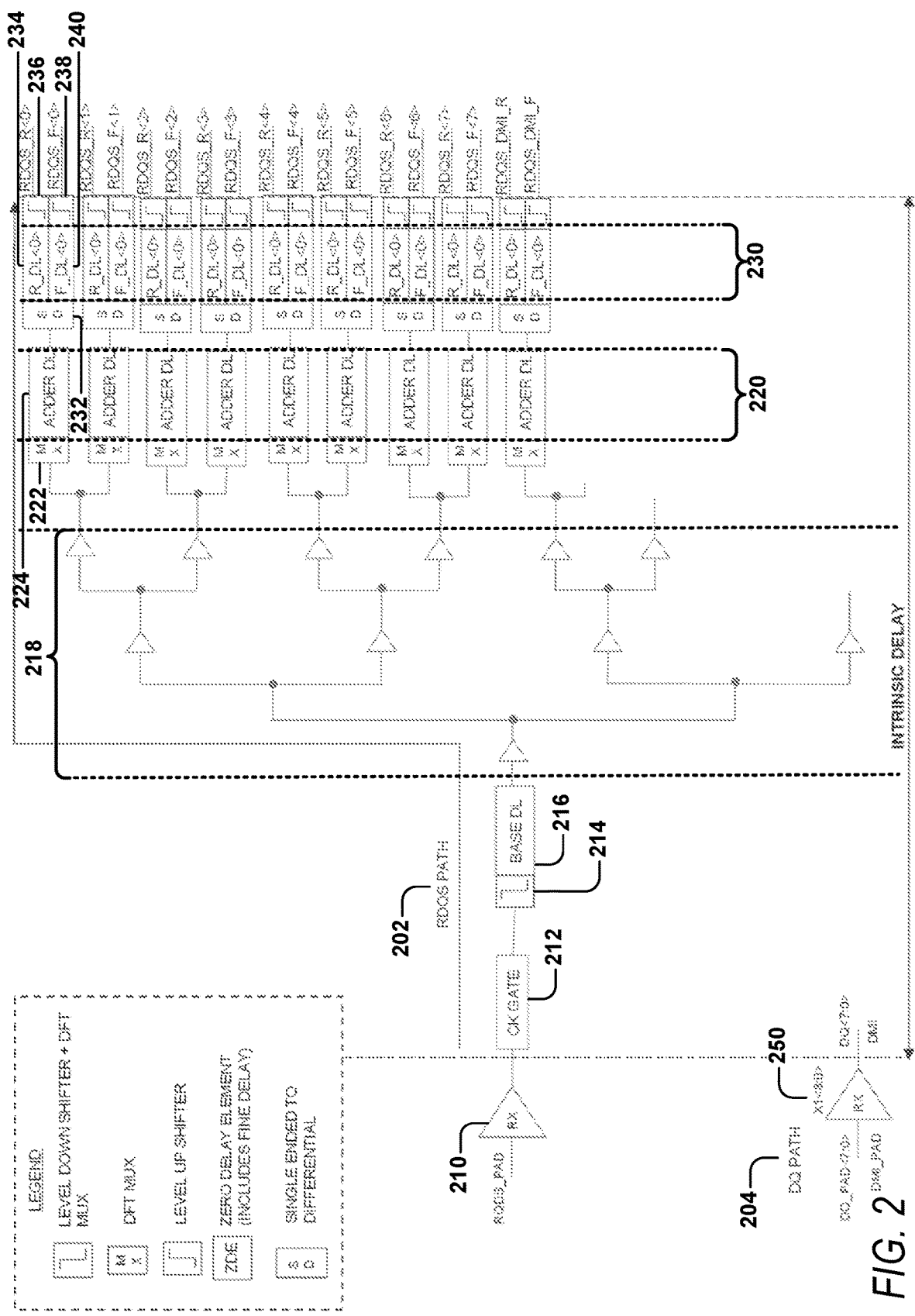
FIG. 2 is a diagram illustrating an example RDQS path having variation compensation and delay lines, in accordance with various embodiments.

FIG. 2 is a diagram illustrating an example read data strobe (RDQS) path 202 having variation compensation and delay lines, in accordance with various embodiments. FIG. 2 also illustrates example data (DQ) paths 204 associated with the RDQS path 202, which can provide data signals carrying data bits (e.g., with respect to different data bit positions of a data word) read from a memory device (e.g., 102). For instance, the DQ paths 204 can comprise eight data paths for data bit positions 7:0 (positions 7 through 0) for an 8-bit data word (e.g., DQ<7:0>), with each DQ path 204 comprising a receiver (RX) buffer 250 (e.g., buffers X1<7:0>), which can operatively couple to a corresponding DQ pin (e.g., a corresponding pad) of a memory device (e.g., DQ_PAD<7:0>). The DQ paths 204 can include an additional data path for a data mask inversion (DMI) signal, which can comprise a receiver (RX) buffer 250 (e.g., buffer X1<8>) that operatively couples to a corresponding DMI pin (e.g., pad) of a memory device (e.g., DMI_PAD). As shown, for various embodiments, the DQ paths 204 do not include a replica of one or more logic blocks or logic gates of the RDQS path 202.

During operation, the RDQS path 202 can receive a read DQ strobe (RDQS) signal from the memory device, where the received RDQS signal can serve as a clock signal for providing different data strobe signals (e.g., RDQS_R<X>, RDQS_F<X>, RDQS_DMI_R, RDQS_DMI_F) for sampling data bits from different data signals provided (e.g., conveyed) by the DQ paths 204—data signals for different data bit positions (e.g., DQ<7:0>) read from a memory device and a DMI signal provided (e.g., conveyed) by the memory device. Where the memory device is a DDR memory device, the RDQS path 202 provides two read DQ strobe (RDQS) signals for each individual path included by the DQ paths 204. For instance, a DQ<X> path for data bit position X can have a RDQS signal (e.g., rise RDQS signal) that enables a data bit to be sampled from a data signal of the DQ<X> path at a rising edge of the RDQS signal received by the RDQS path 202, and a RDQS signal (e.g., fall RDQS signal) that enables a data bit to be sampled from the same data signal (of DQ<X> path) at a falling edge of the RDQS signal received by the RDQS path 202. In particular, for a data signal provided (e.g., conveyed) by a DQ<X> path, a RDQS signal for sampling a data bit from the data signal on a rising edge of a strobe signal can be designated by RDQS_R<X> in FIG. 2, and a RDQS signal for sampling a data bit from the data signal on a falling edge of the strobe signal can be designated by RDQS_F<X> in FIG. 2. Likewise, the RDQS signals for sampling bits from a data signal provided (e.g., conveyed) by the DMI path can use a rising edge RDQS signal designated by RDQS_DMI_R, and a falling edge RDQS signal designated by RDQS_DMI_F.

In accordance with various embodiments, the RDQS path 202 comprises a base delay line component 216 (BASE DL), a plurality of adder delay line components 220 (ADDER DLs), and a plurality of delay line components 230 that include rise delay line components (R_DLs) and fall delay line components (F_DLs). The base delay line component 216 can be operatively coupled (via the RX buffer 210 and the clock gate 212) to an output of the memory device that provides a read data strobe signal. Additionally, the base delay line component 216 can be used to provide (e.g., introduce) skew between data signal provided by the DQ paths 204 and a RDQS signal received by the RDQS path 202, which is a common delay in the RDQS path 202 for all data paths of the DQ paths 204. Each adder data line component can be used to provide (e.g., introduce) de-skewing per a data path of the DQ paths 204. With respect to a given data path of the DQ paths 204, a rise delay line component (e.g., 234) and a fall delay line component (e.g., 238) can compensate for duty cycle distortion (DCD) present in the RDQS path 202 by creating offset between a rise edge RDQS signal received by the rise delay line component and a fall edge RDQS signal being received by the fall delay line component. Each individual delay line component of the RDQS path 204 can be adjusted based on a code (e.g., delay line code) associated with the individual delay line component.

As shown, the RDQS path 202 comprises the RX buffer 210 for receiving a RDQS signal from the memory device, a clock gate 212 (CK gate 212) operatively coupled to an output of the RX buffer 210, a level down shifter 214 operatively coupled to an output of the clock gate 212, the base delay line component 216 operatively coupled to an output of the level shifter 214, and a tree of buffers 218 that operatively couples an output of the base delay line component 216 to design for test (DFT) multiplexers (e.g., DFT mux 222) of the RDQS path 202. Additionally, the RDQS path 202 comprises the adder delay line components 220, where each of the adder delay line components 220 is operatively coupled to an output of a corresponding DFT multiplexer (e.g., the adder delay line component 224 is operatively coupled to an output of the DFT mux 222). The RDQS path 202 comprises single-ended to differential converter (SD) components (e.g., SD 232) that are each operatively coupled to a corresponding output of one of the adder delay line components 220. Each SD component operatively couples one rise delay line component (e.g., rise delay line component 234) and one fall delay line component (e.g., fall delay line component 240) for an individual path included by the DQ paths 204 (e.g., DQ<0> path). In particular, an individual rise delay line component (e.g., 234) can output a rising-edge read data strobe signal for sampling a data bit, from a data signal provided by a data path in the DQ paths 204 (e.g., DQ<0> path) corresponding to the individual rise delay line component, on a rising edge of the read data strobe signal. An individual fall delay line component (e.g., 238) can output a falling-edge read data strobe signal for sampling a data bit, from a data signal provided by a data path in the DQ paths 204 (e.g., DQ<0> path) corresponding to the individual fall delay line component, on a falling edge of the read data strobe signal received by the RDQS path 204.

The RDQS path 202 also comprises level up shifters, each of which is operatively coupled to an output of a different one of the components 230. For instance, a level up shifter 236 is operatively coupled to an output of the rise delay line component 234 and outputs a RDQS signal (RDQS_R<0>) for sampling a data bit from a data signal provided by the DQ<0> path on a rising edge of the RDQS signal received by the RDQS path 202. A level up shifter 238 is operatively coupled to an output of the fall delay line component 238 and outputs a RDQS signal (RDQS_F<0>) for sampling a data bit from a data signal provided by the DQ<0> path on a falling edge of the RDQS signal received by the RDQS path 202.

According to some embodiments, components 216, 218, 222, 220, 230, 232 are in a regulated supply domain (VDDR) while the remaining components are in a core supply domain (VDD). In comparison to the core supply domain, the regulated supply domain can be used to minimize the timing loss due to power supply noise induced jitter. The crossing from the core supply domain to the regulated supply domain is facilitate via the level down shifter 214, while the crossing from the regulated supply domain to core supply domain is facilitated via the level up shifters 236 and 238.

Figure 3:
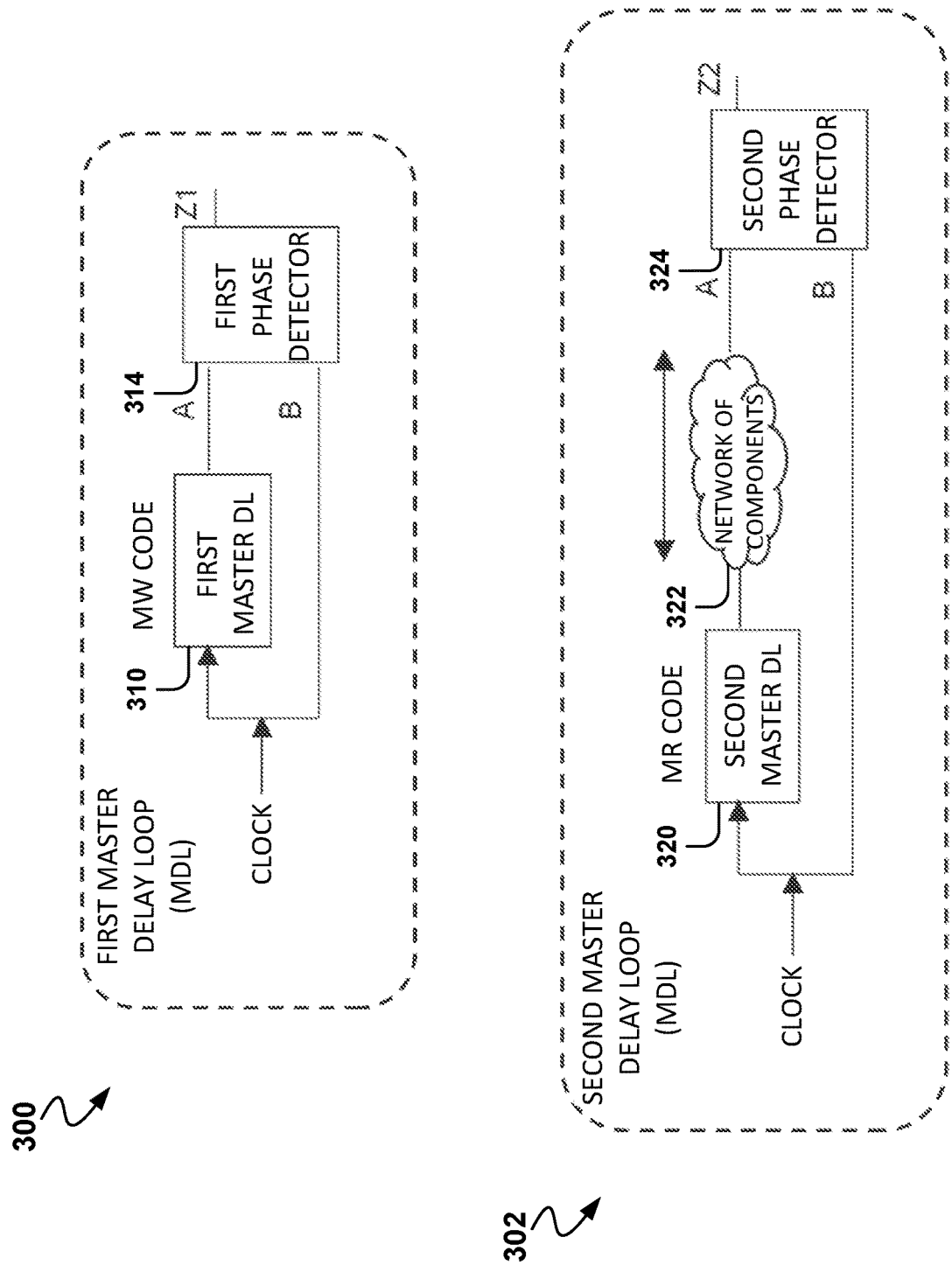
FIGS. 3, 4, 5A, and 5B are diagrams illustrating example master delay loops for use with a RDQS path, in accordance with various embodiments.

FIGS. 3, 4, 5A, and 5B are diagrams illustrating example master delay loops for use with a read data strobe (RDQS) path, in accordance with various embodiments. Referring now to FIG. 3, a first master delay loop (MDL) 300 comprises a first master delay line component 310, and a first phase detector 314 that is operatively coupled to an output of the first master delay line component 310. The first master delay line component 310 can receive a clock signal, and generate a first delayed clock signal based on the clock signal and a first master delay line code of the first master delay line component 310. The first phase detector 314 can determine a first phase difference between the clock signal and the first delayed clock signal, where the first MDL 300 can be configured to apply a first code update to the first master delay line code based on the first phase difference. The clock signal can be generated by a phase-lock loop (PLL) clock generator, and the frequency of the clock signal can be ½ the data rate.

A second master delay loop (MDL) 302 comprises a second master delay line component 320, a network of components 322 that is operatively coupled to an output of the second master delay line component 320, and a second phase detector 324 that is operatively coupled to an output of the network of components 322. For some embodiments, the network of components 322 can model one or more logic gates or logic blocks (e.g., combinatorial logic) included by the RDQS path but not included by an individual data path of the set of data paths (e.g., DQ paths 204). The second master delay line component 320 can receive the clock signal (same as the first master delay line component 310), and generate a second delayed clock signal based on the clock signal and a second master delay line code of the second master delay line component 320. The network of components 322 can generate a third delayed clock signal based on the second delayed clock signal from the second master delay line component 320. The second phase detector 324 can determine a second phase difference between the clock signal and the third delayed clock signal, where the second MDL 302 can be configured to apply a second code update to the second master delay line code based on the second phase difference.

According to various embodiments, the first and the second MDLs 300, 302 facilitate updates (e.g., adjustments) to codes of one or more of the base delay line component (e.g., 216), the plurality of adder delay line components (e.g., 220), the plurality of rise delay line components (e.g., 230), and the plurality of fall delay line components (e.g., 230) of a RDQS path (e.g., 202). In particular, the first MDL 300 can be used to determine (e.g., obtain) VT drift information of one or more delay elements included by the RDQS path based on a code of the first master delay line component 310 (also referred to as MW code) that controls a delay applied by the first master delay line component 310 in the first MDL 300. A second MDL 302 can be used to determine (e.g., obtain) VT drift information of one or more delay elements included by the RDQS path and VT drift information of one or more logic gates or logic blocks of the network of components 322.

At initialization of the first MDL 300, the MW code can be adjusted (e.g., by microcontroller, which can implement a full state machine) until a phase difference Z1 (e.g., first phase difference) between points A and B is equal to $2\pi$ radians (e.g., delay difference between A and B is 2 unit intervals (UI), where 1 UI is equal to 1/data rate). Similarly, at initialization of the second MDL 302, the MR code can be adjusted (e.g., by microcontroller, which can implement a full state machine) until a phase difference Z2 (e.g., second phase difference) between points A and B is equal to $2\pi$ radians. The resulting, initial MW and MR codes can be referred to herein as $MW_I$ code and $MR_I$ code.

During an initial training process of the RDQS path (e.g., 202), codes of the delay line components of the RDQS path can be updated (e.g., adjusted) to initially train the relative position of data signals on DQ paths and data strobe signals on the RDQS path such that the data strobe signals positioned at the center of data bits carried by the data signals. A microcontroller (not shown) can facilitate this training process, and determine one or more code updates for the base delay line code, adder delay line codes of the plurality of adder delay line components, rise delay line codes of the plurality of rise delay line components, and fall delay line codes of the plurality of fall delay line components. More regarding the initial training of codes of the delay line components of the RDQS path is illustrated and described with respect to FIG. 10.

After some time, when voltage and temperature (VT) drifts, the MW code and the MR code can be adjusted again (e.g., by microcontroller) until the phase differences between points A and B reaches $2\pi$ radians again. In this way, some embodiments compensate for an increase of delay in the network of components 322 after the VT drift by adjusting the MR code (e.g., decreasing the MR code) to decrease the delay applied by the second master delay line component 320, and compensate for a decrease of delay in the network of components 322 after the VT drift by adjusting the MR code (e.g., increasing the MR code) to increase the delay applied by the second master delay line component 320. The resulting MW and MR codes (obtained after VT drift) can be referred herein as $MW_F$ and $MR_F$. Based on the $MW_F$ code and the $MR_F$ code, the codes of the delay line components of the RDQS path can be updated (e.g., adjusted) such that the relative position of data signals on DQ paths and data strobe signals on the RDQS path is maintained after VT drift. For example, a microcontroller (not shown) can be used to determine one or more code updates for the base delay line code, adder delay line codes of the plurality of adder delay line components, rise delay line codes of the plurality of rise delay line components, and fall delay line codes of the plurality of fall delay line components based on the first master delay line code (e.g., $MW_F$ code) and the second master delay line code (e.g., $MR_F$ code). Herein, codes of delay line components of a RDQS path updated based on the first master delay line code (e.g., MW code) and the second master delay line code (e.g., MR code) can be referred to as secondary codes, as these codes are determined or updated based on VT drift information provided by the first and the second master delay line codes.

The following provides calculations performed (e.g., by a microcontroller) to use the first master delay line code (e.g., MW code) and the second master delay line code (e.g., MR code) to update the codes of the delay line components of the RDQS path. In particular, the following calculations in Table 1 can be used to compensate for delay change due to VT drift in delay elements used in the RDQS path (e.g., 202).

TABLE 1

| | |
|---|---|
| Variables | $MW_I$ = MW code at initialization, $MW_F$ = MW code after VT drift $MR_I$ = MR code at initialization, $MR_F$ = MR code after VT drift, $DE_I$ = Delay element's delay at initialization (ps), $DE_F$ = Delay element's delay after VT drift (ps), $S_I$ = Secondary code of a delay line component (e.g., base, adder, rise, fall) at initialization, $S_F$ = Secondary code of the delay line component after $V_T$ drift, $C_I$ = Combo delay at initialization (ps), $C_F$ = Combo delay after VT drift (ps) |
| Master Delay Loop Calculations | Given that in the first master delay line component, delay difference between A and B = 2UI: $MW_I * DE_I$ = 2UI, $MW_F * DE_F$ = 2UI As a such: $MW_I * DE_I = MW_F * DE_F$ (Equation 1) |
| Secondary Code Calculation | Delay provided by delay line components of RDQS path after VT drift needs to be equal to the delay provided by the delay line components provided at initialization. This means that: $S_F * DE_F = S_I * DE_I$ (Equation2) Based on Equation1 and Equation2, we determine: $S_F = S_I * (MW_F/MW_I)$ (Equation3) Secondary code of all delay line components (e.g., base, adder, rise and fall delay line components) can be updated using Equation3. |

By use of Equation3 of Table 1, various embodiments can use the first and the second MDLs 300, 302 to update secondary codes of the base, adder, rise and fall delay line components of a RDQS path to compensate for delay change due to VT drift in delay elements of the RDQS path.

After using Formula 3 to update secondary codes of the base, adder, rise and fall delay line components of a RDQS path, the following calculations in Table 2 can be used to compensate for delay change due to VT drift in logic blocks and logic gates (e.g., combinatorial logic) in the RDQS path (e.g., 202). In particular, some embodiments use the calculations of Table 2 to update the code of the base delay line component for delay change due to VT drift in logic blocks and logic gates in the RDQS path.

TABLE 2

| | |
|---|---|
| Variables | $MW_I$ = MW code at initialization, $MW_F$ = MW code after VT drift $MR_I$ = MR code at initialization, $MR_F$ = MR code after VT drift, $DE_I$ = Delay element's delay at initialization (ps), $DE_F$ = Delay element's delay after VT drift (ps), $S_I$ = Secondary code of a delay line component (e.g., base, adder, rise, fall) at initialization, $S_F$ = Secondary code of the delay line component after VT drift, $C_I$ = Combo delay at initialization (ps), $C_F$ = Combo delay after VT drift (ps) |
| VT Drift Logic Delay Evaluation | Delay of second master delay line component + Delay of logic blocks and logic gates of RDQS path (logic delay): N * UI {where "N" depends on a divider ratio; the value of N can depend on the data rate and can be selected to avoid false locking of a read side MDL; e.g., for 8533 Mbps, N can be 6} $MR_I * DE_I + C_I = N * UI$, $MR_F * DE_F + C_F = N * UI$ $MR_I * DE_I + C_I = MR_F * DE_F + C_F$ $C_I - C_F = MR_F * DE_F - MR_I * DE_I$ $C_I - C_F = DE_F * (MR_F - \{MR_I * DE_I/DE_F\})$ This results in Equation 4: $C_I - C_F = DE_F * (MR_F - \{MR_I * MW_F /MW_I\})$ [where ($DE_I/DE_F$) of Equation3 is substituted with ($MW_F/MW_R$) from Formula 3)] |
| Calculations for Compensating | Equation 4 provides the VT drift information of delay of logic blocks and logic gates of RDQS path (logic delay). This delay can be adjusted against the delay |

TABLE 2-continued

| | |
|---|---|
| for VT Drift of Logic Delay | provided by the base delay line component. For example, if after VT drift, logic delay reduces, the code for the base delay line component can be increased to compensate for the logic delay decrease, so that the total delay remains constant.<br>Accordingly, based on Equation 4:<br>$C_I - C_F = DE_F * (MR_F - \{MR_I * MW_F/MW_I\})$<br>Logic delay change in units of delay elements:<br>$\Delta C = (C_I - C_F)/ DE_F$<br>$\Delta C = MR_F - \{MR_I * MW_F/MW_I\}$ (Equation 5)<br>Accordingly, if $(MR_F/MR_I) > (MW_F/MW_I)$, the code of the base delay line component is increased, else the code of the base delay line component is decreased.<br>The code of the base delay line component is the one obtained using Equation 3 plus $\Delta C$:<br>$S_F + \Delta C$ (Equation 6) |

By use of Equation 6 of Table 2, various embodiments can use the first and the second MDLs 300, 302 to update secondary code of the base delay line component of a RDQS path to compensate for delay change due to VT drift in logic blocks and logic gates of the RDQS path.

Depending on the embodiment, the frequency with which secondary codes are updated can depend on a memory system's timing margins (e.g., more margin means secondary updates can be triggered less frequently) and how fast the memory system's voltage and temperature drifts. For some embodiments, the MR and MW codes are monitored, and secondary code updates are triggered in response to a MR or MW code changing more than a predetermined threshold value (e.g., user defined threshold value).

Where the delay of the network of components 322 is larger than 2UI, the second MDL 302 can lead to an inaccurate determination of a MR code (e.g., false locking of the MR code) to a value corresponding to a phase difference higher than $2\pi$ radians (e.g., $4\pi$ radians, $6\pi$ radians, and the like) rather than a phase difference of $2\pi$ radians. To avoid such inaccuracies (e.g., false locking of MR code), some embodiments can divide the clock signal by a factor that depends on the frequency value of the clock signal and the characterization of the network of components 322 across process, voltage, and temperature (PVT). An example of a second MDL that divides a clock signal is illustrated and described with respect to FIG. 5.

Figure 4:
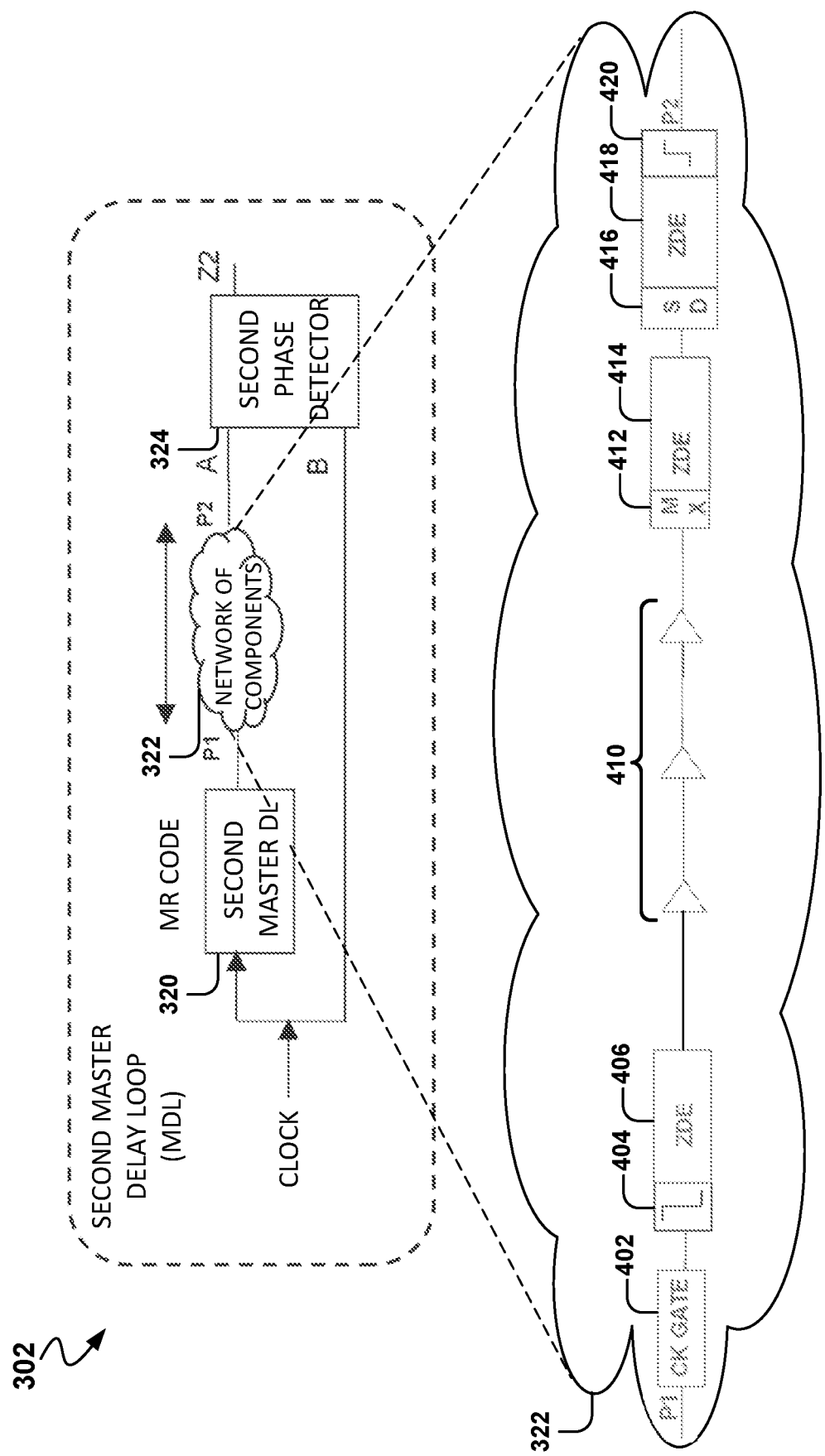

Referring now to FIG. 4, an example of the network of components 322 is illustrated. According to various embodiments, the network of components 322 comprises one or more logic blocks and logic gates of the RDQS path (e.g., 202) that are not included by any of the DQ paths (e.g., 204). By including the network of components 322, the second MDL 302 can enable an embodiment to obviate the need to replicate the network of components 322 in each of the DQ paths (e.g., 204) as conventional technologies do. As shown, the network of components 322 comprises a clock gate 402, a level down shifter 404 operatively coupled to the clock gate 402, a zero delay element (ZDE) 406 operatively coupled to the level down shifter 404, a series of buffers 410 operatively coupled to the ZDE 406, a design for test (DFT) multiplexer 412 operatively coupled to the series of buffers 410, a ZDE 414 operatively coupled to the DFT multiplexer 412, a single-ended to differential converter (SD) 416 operatively coupled to the ZDE 414, a ZDE 418 operatively coupled to the SD 416, and a level up shifter 420 operatively coupled to the ZDE 418. For some embodiments, the logic blocks and logic gates included by the network of components 322 represent those present in the RDQS path 202 of FIG. 2. For instance, the clock gate 402 can correspond to the clock gate 212, the level down shifter 404 can correspond to the level down shifter 214, the ZDE 406 can correspond to the base delay line component 216, the series of buffers 410 can correspond to the tree of buffers 218, the DFT multiplexer 412 can correspond to the DFT multiplexers (e.g., 222) of the RDQS path 202, the ZDE 414 can correspond to the adder delay line components 220, the SD 416 can correspond to the SDs (e.g., 232) of the RDQS path 202, the ZDE 418 can correspond to rise and fall delay line components 230, and the level up shifter 420 can correspond to the level up shifters (e.g., 236, 238) of the RDQS path 202.

Figure 5A:
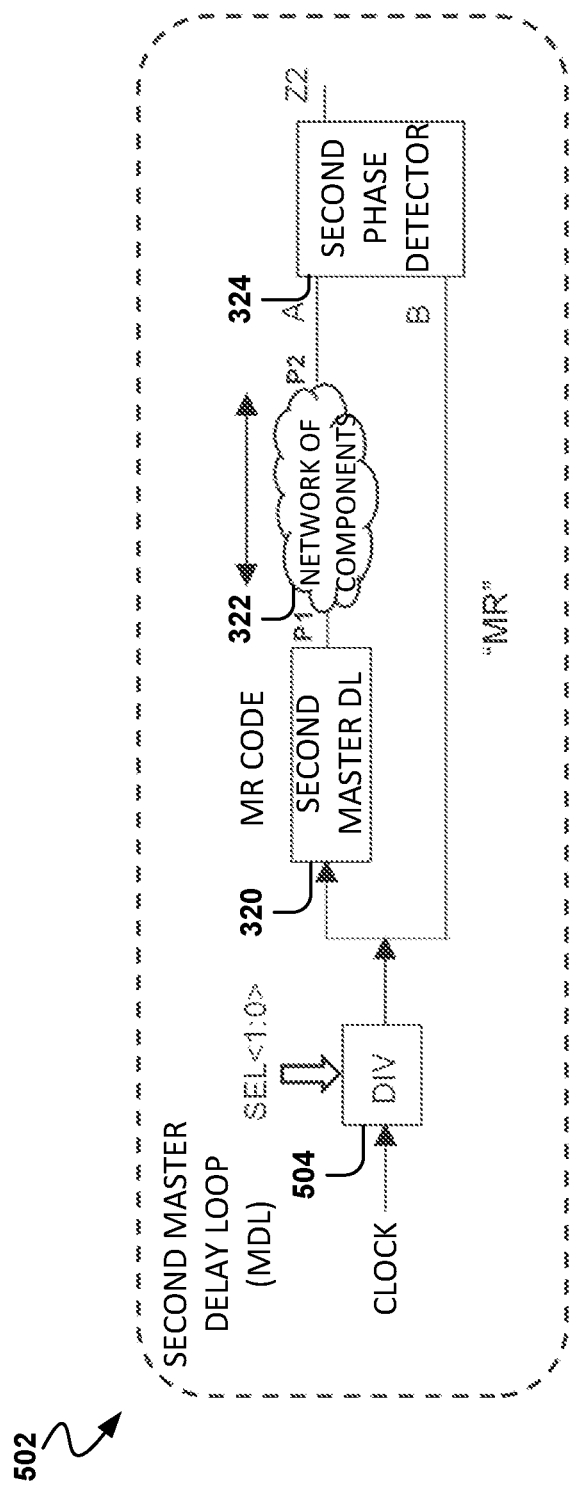

Referring now to FIG. 5A, an example of a second MDL 502 configured to divide a clock signal is illustrated. Like the second MDL 302 of FIG. 3, the second MDL 502 comprises the second master delay line component 320, the network of components 322 that is operatively coupled to an output of the second master delay line component 320, and the second phase detector 324 that is operatively coupled to an output of the network of components 322. Unlike the second MDL 302 of FIG. 3, the second MDL 502 comprises a frequency divider 504 that is configured to receive a clock signal and generate a frequency divided clock signal generated based on the clock signal and a selection input value (SEL<1:0>) of the frequency divider 504. According to some embodiments, the selection input value is determined based on a factor that depends on the frequency value of the clock signal and the characterization of the network of components 322 across process, voltage, and temperature (PVT). The following Table 3 presents example selection input values and division ratios based on a data rate of the memory system and the network of components having a delay in the range of 200 ps-600 ps.

TABLE 3

| Data rate (Mbps) | SEL<1:0> | Frequency Division Ratio |
|---|---|---|
| <2400 | 2'b 00 | 1 |
| 2400 to 5600 | 2'b 01 | 2 |
| 5600 to 8533 | 2'b 10 | 3 |
| >8533 | 2'b 11 | 4 |

For instance, at a data rate of 8533 Mbps, with the combinational delay the network of components 322 varying between 200 ps to 600 ps across PVT, to avoid false locking of the MR code, the clock signal can be divided by the frequency divider 504 by a division ratio of 3 (e.g., based on the max combinational delay being less than 6UI at a data rate of 8533 Mbps). For some embodiments, the factors and division ratios (e.g., enumerated in Table 3) can be determined based on testing or experimentation of a system.

Figure 5B:
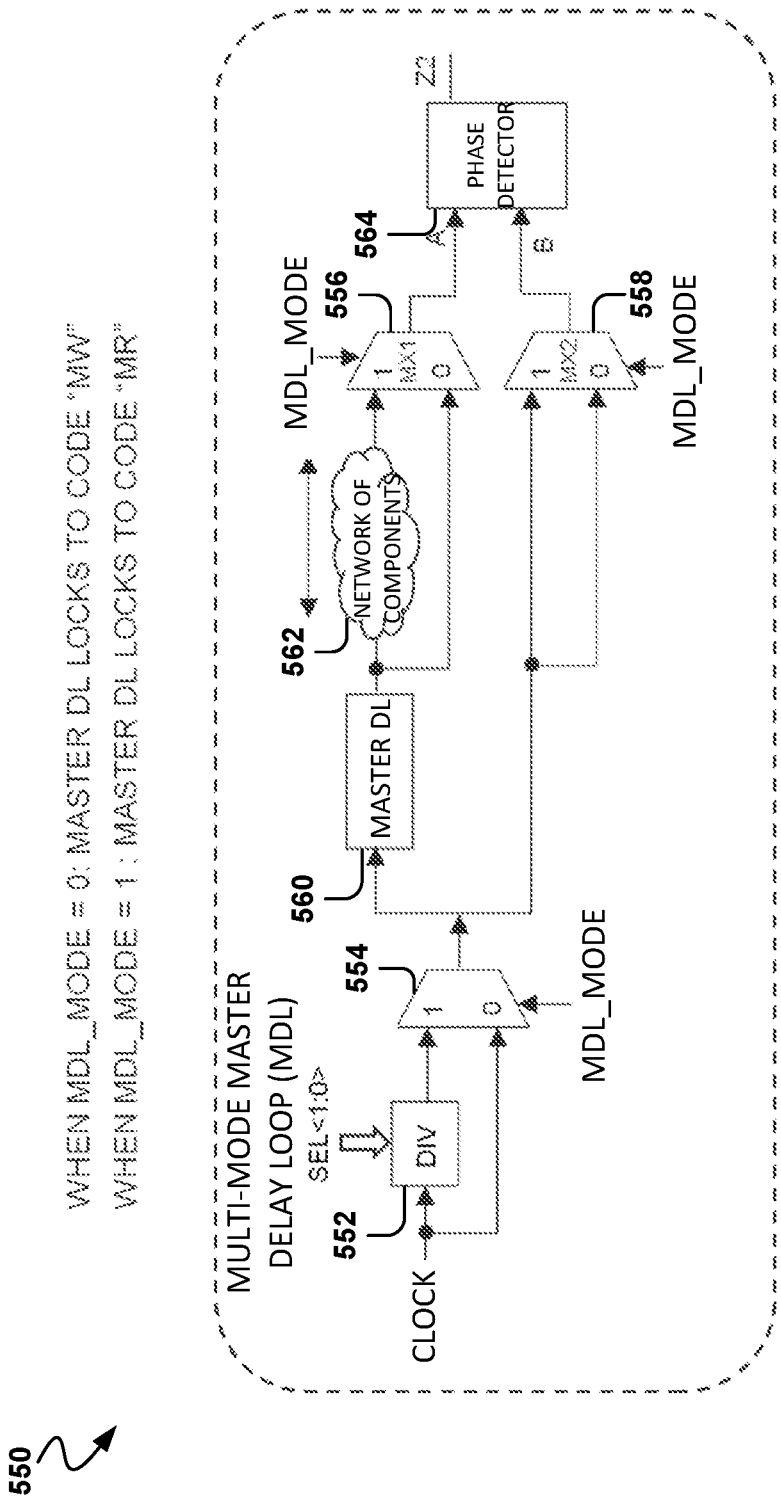

Referring now to FIG. 5B, a multi-mode MDL 550 is presented, where the multi-mode MDL 550 is configured to operate as a first MDL (e.g., 300) when set to a first mode, and to operate as a second MDL (e.g., 502) that divides a clock signal (to avoid false code locking) when set to a second mode. For some embodiments, the MDL 550 combines the functionality of the first MDL (e.g., 300) and the second MDL (e.g., 502) and, accordingly, can be used in place of the first MDL (e.g., 300) and the second MDL (e.g., 502). In doing so, multi-mode MDL 550 can provide some embodiments with more efficient design (e.g., occupies less circuit design area than have the two separate MDLs). As shown, the multi-mode MDL 550 comprises a frequency divider 552, multiplexers 554, 556, 558, a master DL 560, a network of components 562, and a phase detector 564. For some embodiments, the frequency divider 552 operates similar to the frequency divider 504 of FIG. 5A, the master DL 560 is similar to either the first master DL 310 or the second master DL 320 of FIG. 3, the network of components 562 is similar to the network of components 322 of FIG. 3, and the phase detector 564 is similar to either the first phase detector 314 or the second phase detector 324 of FIG. 3.

In FIG. 5B, an input of the frequency divider 552 receives a clock signal, an output of the frequency divider 552 is operatively coupled to a first input of the multiplexer 554, and a second input of the multiplexer 554 receives the clock signal. An output of the multiplexer 554 is operatively coupled to an input of the master DL 560 and operatively coupled to a first input and a second input of the multiplexer 558. For some embodiments, the multiplexer 558 is similar to the multiplexer 556 and intended to function as a dummy multiplexer to help track VT drift of the multiplexer 556. For instance, as a dummy multiplexer, the multiplexer 558 can cancel the delay of the multiplexer 556, so that delay of the multiplexer 556 does not impact the phase difference detected by the phase detector 564 between clocks between the two circuit networks. An output of the master DL 560 is operatively coupled to an input of the network of components 562 and operatively coupled to a second input of the multiplexer 556. An output of the network of components 562 is operatively coupled to a first input of the multiplexer 556. An output of the multiplexer 556 is operatively coupled to a first input of the phase detector 564, and output of the multiplexer 558 is operatively coupled to a second input of the phase detector 564.

According to some embodiments, each of the multiplexers 554, 556, 558 comprises a multiplexer selection input that receives a MDL_MODE input value of determines a current mode of operation of the multi-mode MDL 550. In particular, when the MDL_MODE input value is set to 0, the multi-mode MDL 550 can operate as a first MDL (e.g., 300) and be used to determine a MW code (e.g., based an update to the master delay line code of the master DL 560 in view of the phase difference determined by the phase detector 564), and when the MDL_MODE input value is set to 1, the multi-mode MDL 550 can operate as a second MDL (e.g., 502) and be used to determine a MR code (e.g., based an update to the master delay line code of the master DL 560 in view of the phase difference determined by the phase detector 564). During operation, the MDL_MODE input value can be initially set to 0, the multi-mode MDL 550 can then lock, the MW code can be obtained after the lock, and the MW code can be stored in a separate register. Thereafter, the MDL_MODE input value can be set to 1, an appropriate SEL<1:0> setting can be set (e.g., to avoid false locking of the MR code), and then a fresh relock can be performed to obtain the MR code. In this way, the write and read side MDL codes are obtained at initialization and after VT drift.

Figure 6A:
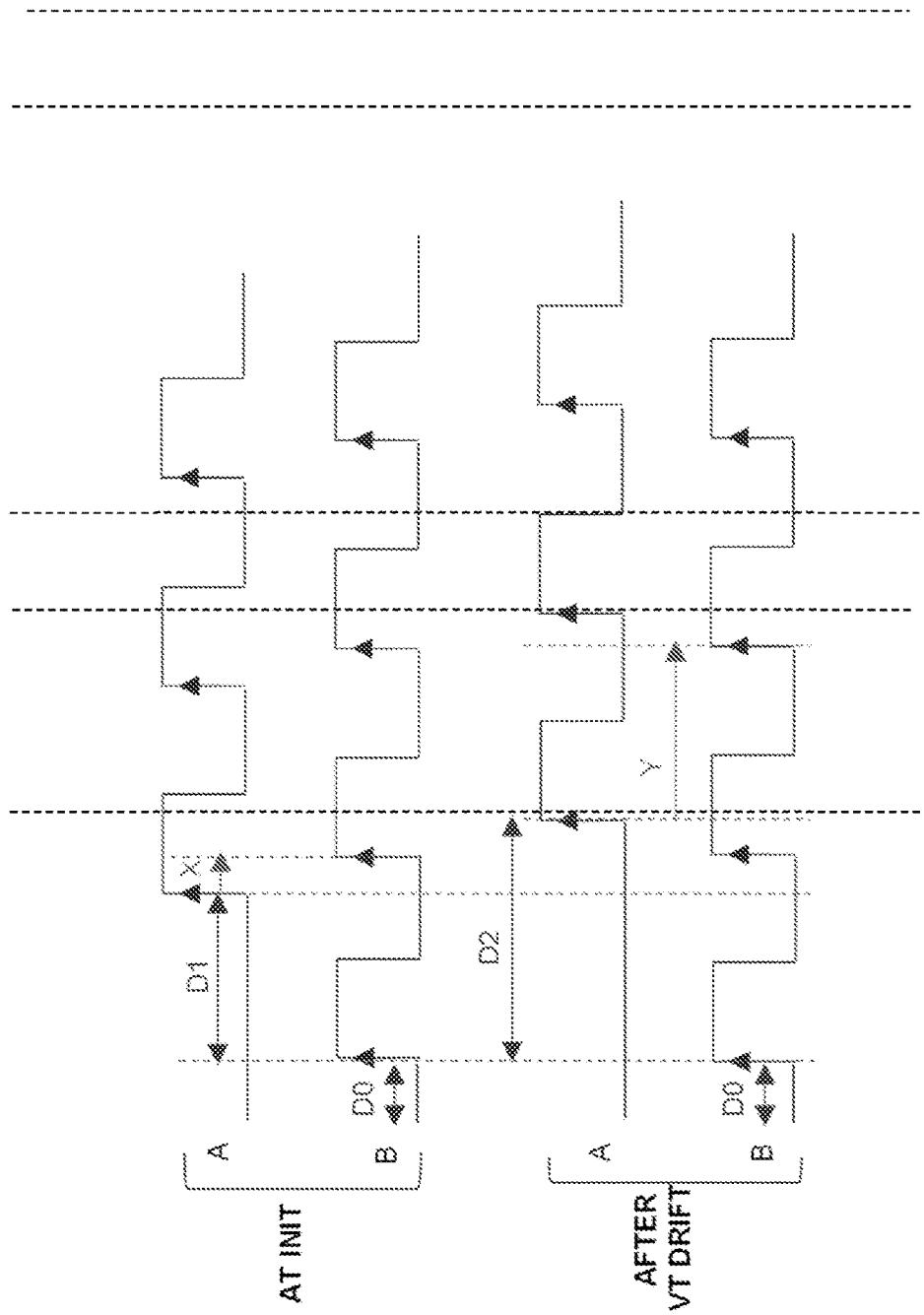
FIGS. 6A and 6B presents timing diagrams that illustrate a case of false locks of a code of a MDL and a case of where applying an appropriate division ratio by a frequency divider can help avoid false locking of a code of a MDL, in accordance with various embodiments.

FIG. 6A presents a timing diagram that illustrates a case of where false locking of a MR code would result for the second MDL 302, which does not include a frequency divider as described herein. For the graphs 600, D0 represents a zero code delay of the second MDL 302, D1 represents a combination delay at initialization (e.g., 200 ps), D2 represents a combination delay after VT drift (e.g., 250 ps), X represents a delay of the second master delay line component 320 required for lock at initialization, and Y represents a delay of the second master delay line component 320 required for lock after VT drift.

Figure 6B:
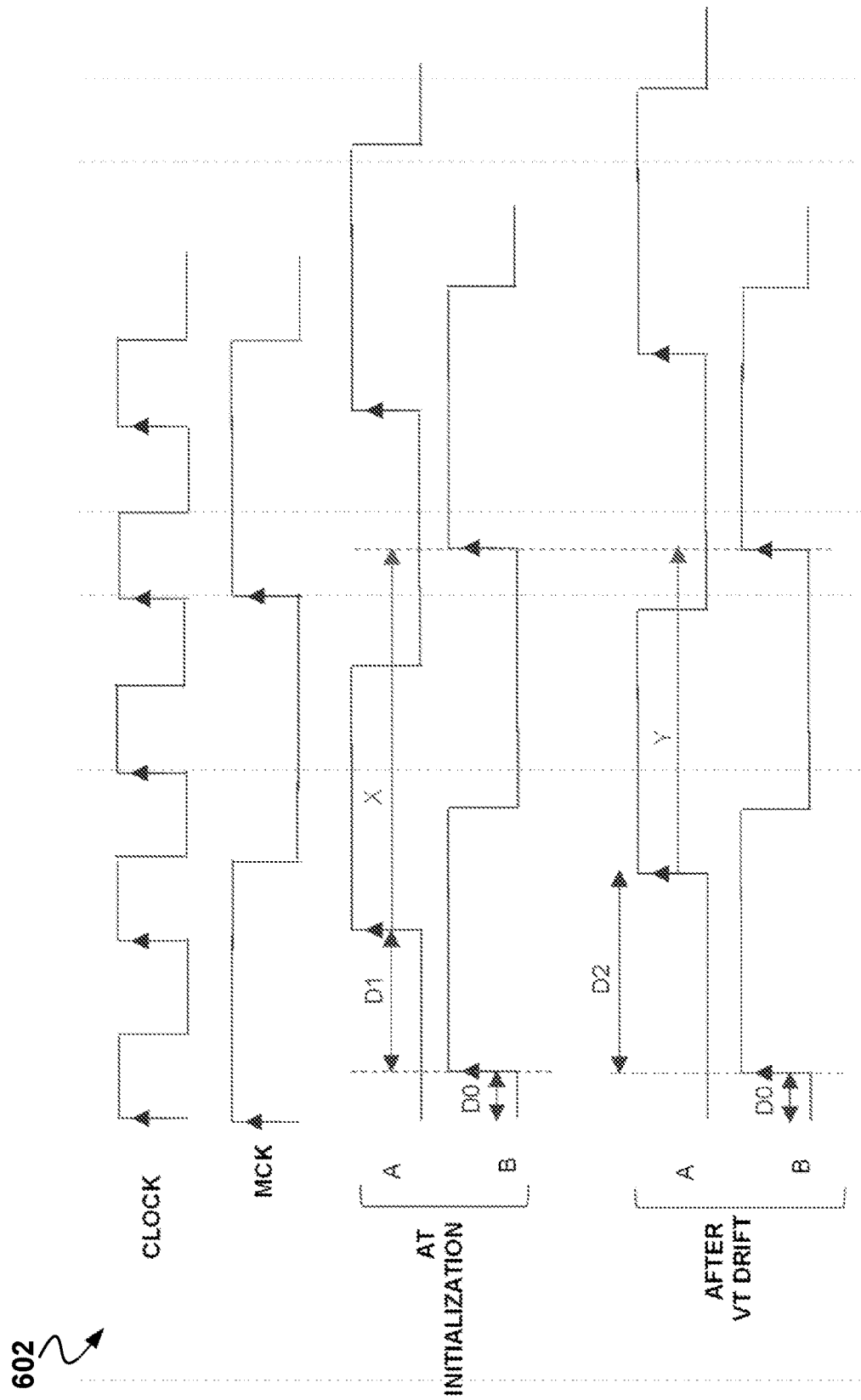

FIG. 6B presents a timing diagram that illustrates a case of where applying an appropriate division ratio (e.g., 3) by the frequency divider 504 can help avoid false locking of the MR code of the second MDL 502, in accordance with various embodiments. For the graphs 602, D0 represents a zero code delay of the second MDL 502, D1 represents a combination delay at initialization (e.g., 200 ps), D2 represents a combination delay after VT drift (e.g., 250 ps), X represents a delay of the second master delay line component 320 required for lock at initialization, and Y represents a delay of the second master delay line component 320 required for lock after VT drift. In particular, the graphs 602 illustrate that |X−Y| is equal to |D2−D1|, which facilitates correct determination of VT drift information using the second MDL 502. Based on the following Table 4, the correct locking of the MR code could be achieved by the second MDL 502 using a division ratio selection of 3 (SEL<1:0> of the frequency divider 504 being set to 2'b 10 for a data rate between 5600 to 8533).

TABLE 4

| Data Rate (Mbps) | SEL<1:0> of Frequency Divider | Frequency Division Ratio |
| --- | --- | --- |
| <2400 | 2'b 00 | 1 |
| 2400 to 5600 | 2'b 01 | 2 |
| 5600 to 8533 | 2'b 10 | 3 |
| >8533 | 2'b 11 | 4 |

Figure 7:
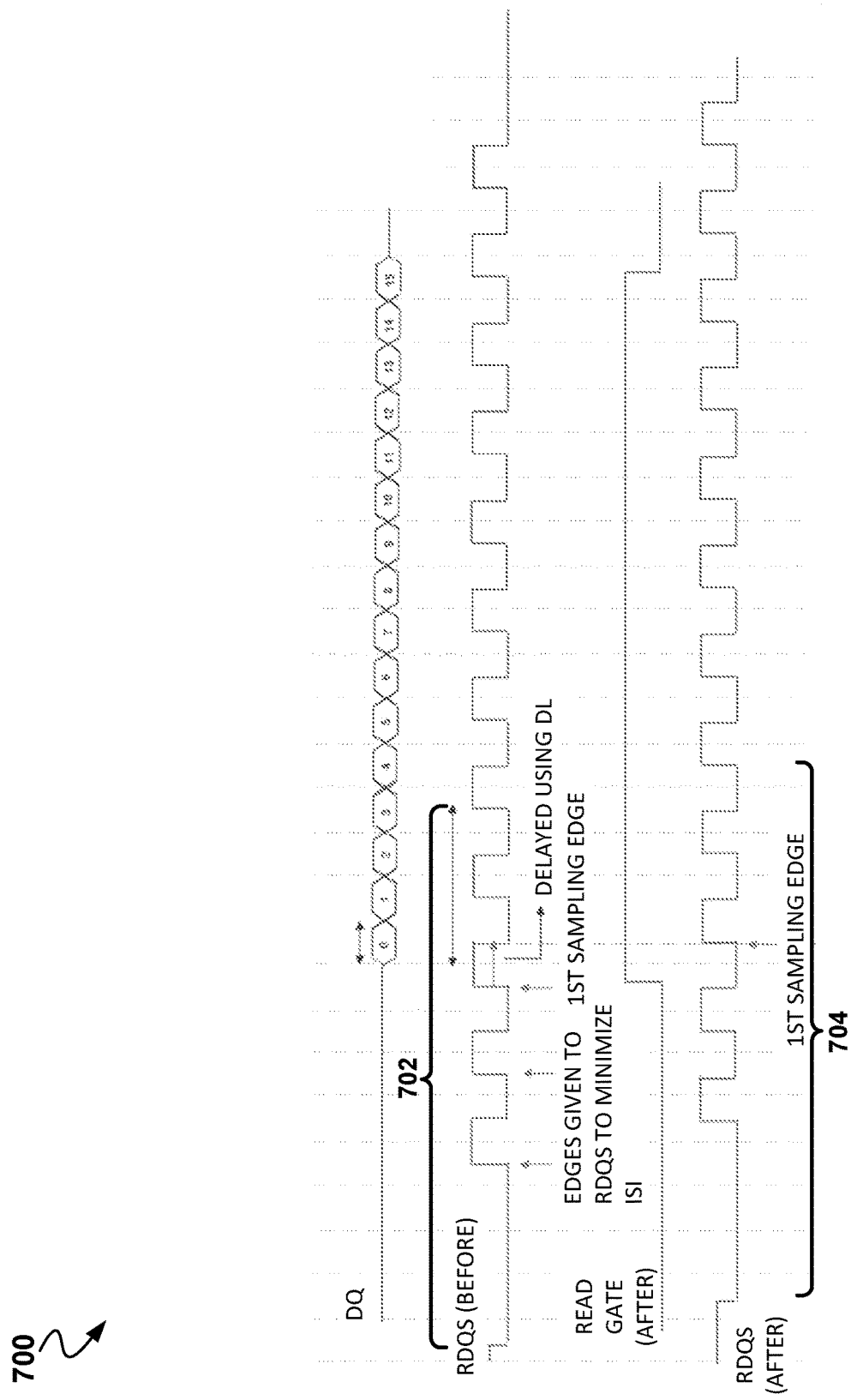
FIG. 7 presents a timing diagram that illustrate use of pre-amble edges of a RDQS signal, in accordance with various embodiments.

FIG. 7 presents a timing diagram 700 that illustrate use of pre-amble edges 702, 704 of a read data strobe (RDQS) signal, in accordance with various embodiments. In particular, the timing diagram 700 shows an example of where pre-amble edges 702, 704 of the RDQS signal are used to sample bits. Various embodiments use the pre-amble edges of the RDQS signal given that the DQ paths (e.g., 202) do not include replica one or more logic blocks and logic gates of RDQS path and, as such, data signals on the DQ paths will arrive earlier than the RDQS signal at the sampling flops. For instance, a 4TWCK or 3TWCK (Time Period of Write Clock) pre-amble edges of the RDQS signal can be used for memory system. Traditionally, 4TWCK and 3TWCK pre-ample edge of the RDQS signal are used to minimize ISI of present within RDQS input/output signals and not used to sample data bits. For some embodiments, after the delay line components of the RDQS are trained, the read gate is enabled such that one or more pre-amble edges of the RDQS signal are used to start sample bits carried by data signals provided by one or more DQ paths.

Figure 8:
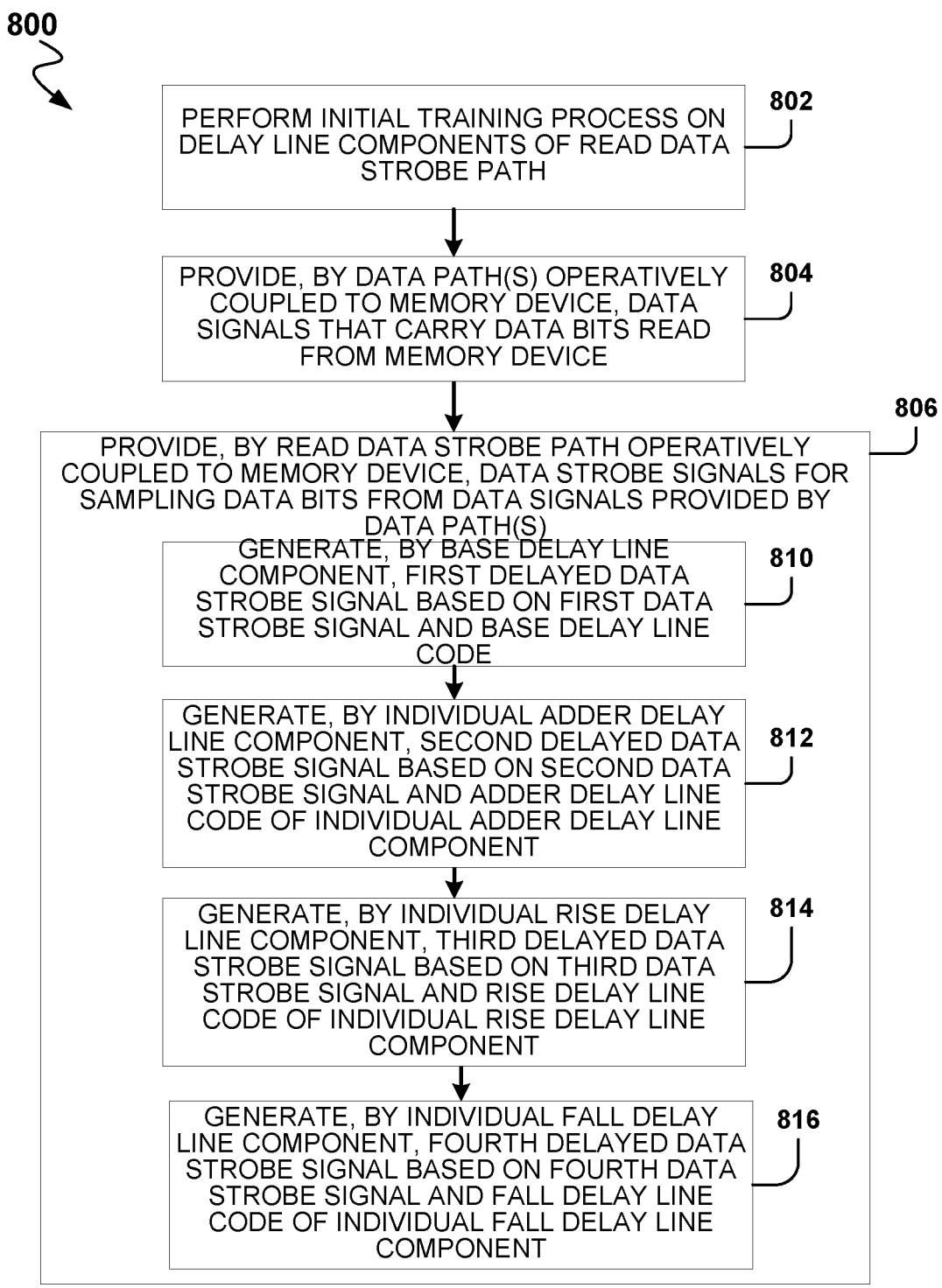
FIGS. 8 through 10 are flowcharts illustrating example methods for a RDQS path having variation compensation and delay lines, in accordance with various embodiments.
Figure 9:
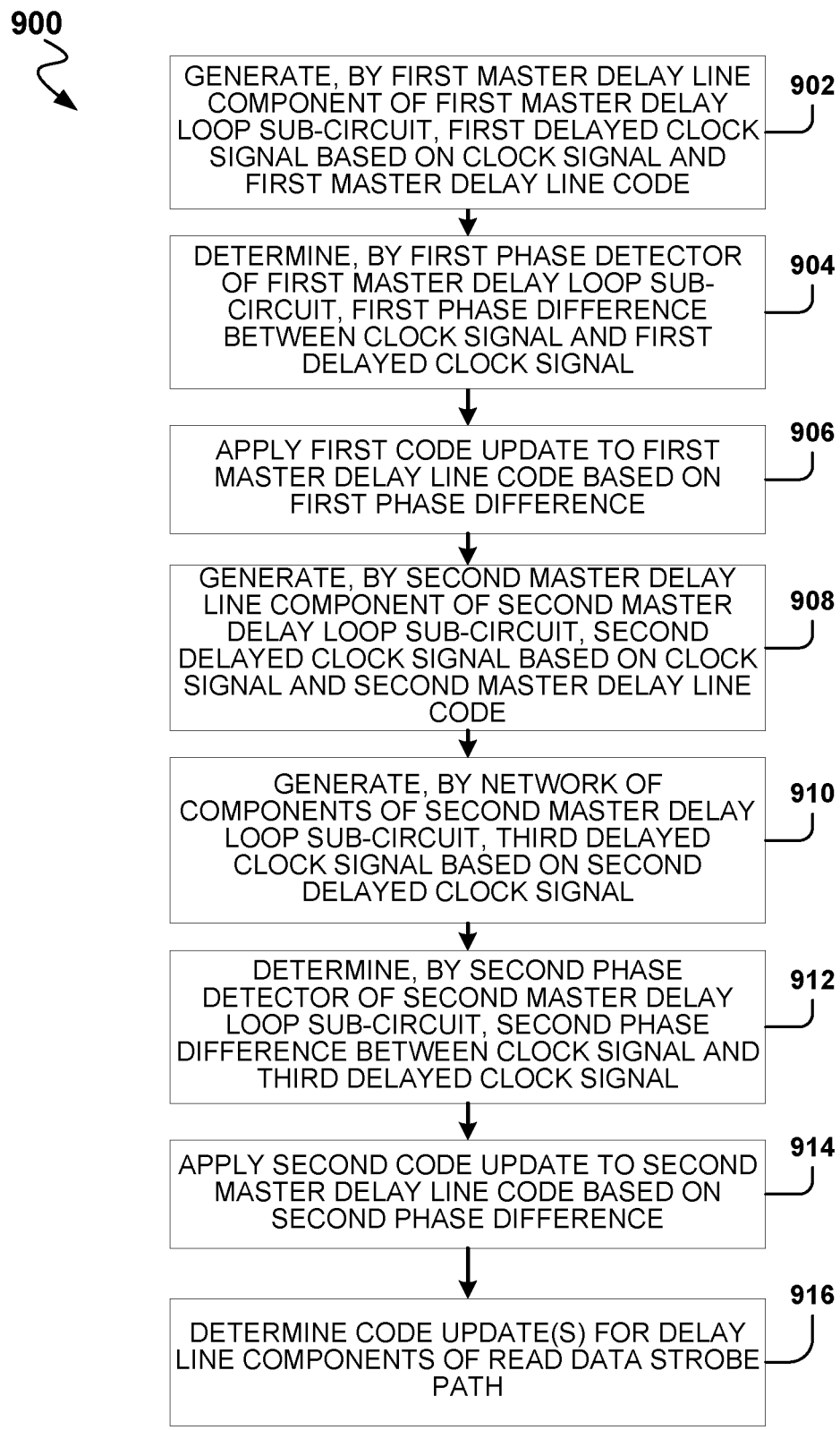
Figure 10:
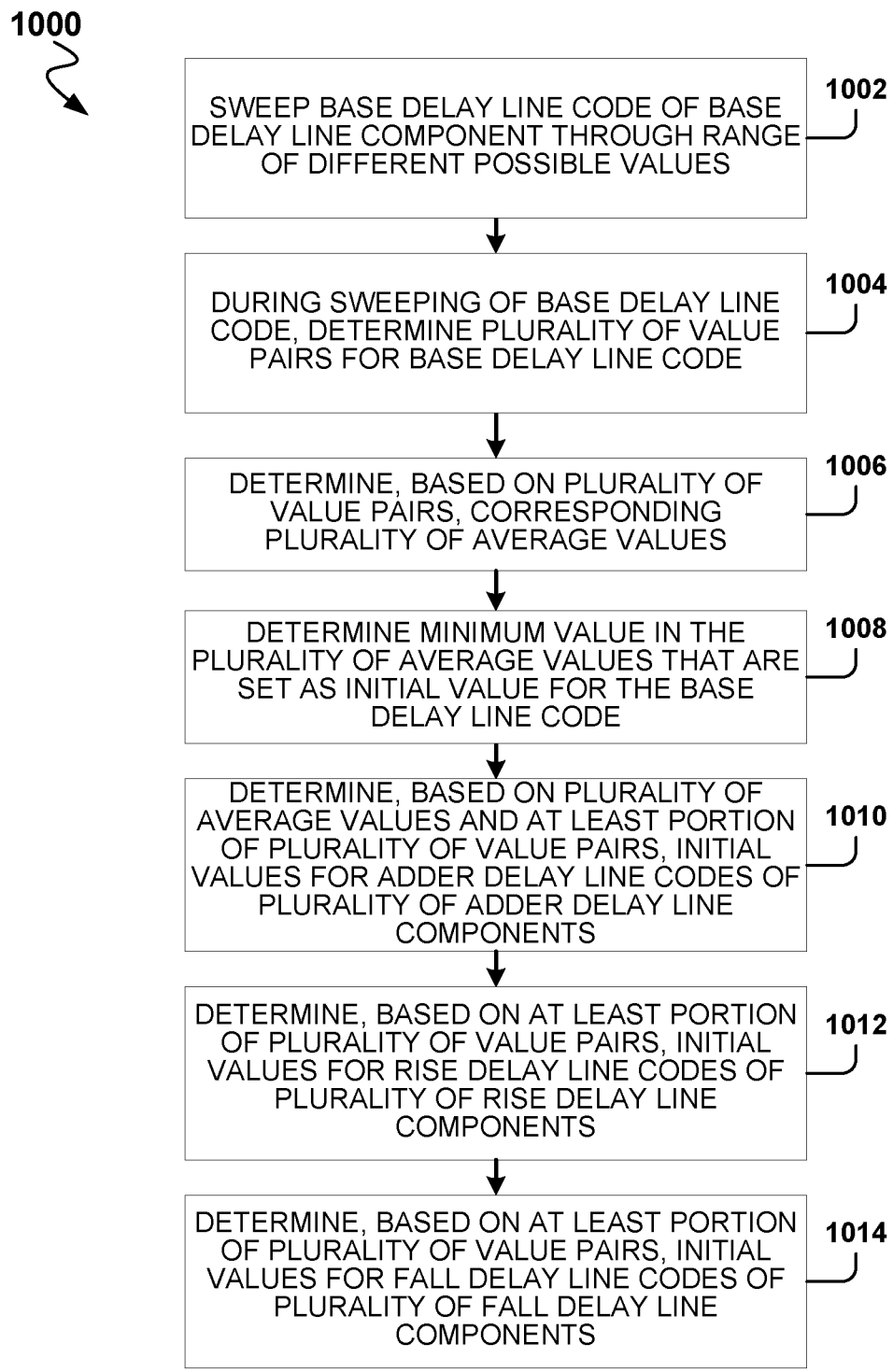

FIGS. 8 through 10 are flowcharts illustrating example methods 800, 900, 1000 for a read data strobe (RDQS) path having variation compensation and delay lines, in accordance with various embodiments. For some embodiments, at least some portion of the methods 800, 900, or 1000 is performed by a RDQS path similar to the RDQS path described herein, such as the RDQS path 202 of FIG. 2. Additionally, for some embodiments, one or more operations of at least one of the methods 800, 900, or 1000 is performed by a microcontroller (e.g., of the PHY interface or the memory system). Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. Further, for some embodiments, a method described herein may have more or fewer operations than otherwise depicted.

Referring FIG. 8, the method 800 illustrates an example of using a read data strobe path, in accordance with various embodiments. At operation 802, an initial training process is performed on delay line components of the read data strobe path (e.g., by a microcontroller). Operation 802 can be performed prior the determination of one or more code updates to delay line components of the read data strobe path. More regarding the initial training process is illustrated and described with respect to FIG. 10, and more regarding the determination of code updates to delay line components of the read data strobe path is illustrated and described with respect to FIGS. 3 and 9.

During operation 804, one or more data paths (e.g., DQ paths), which are operatively coupled to a memory device, provide one or more data signals carry data bits read from the memory device. During operation 806, a read data strobe path (e.g., RDQS path), which is operatively coupled to the memory device, data strobe signals for sampling the data bits from the data signals provided by the one or more data paths. For various embodiments, the read data strobe path comprises a base delay line component, a plurality of adder delay line components operatively coupled to an output of the base delay line component, a plurality of rise delay line components operatively coupled to outputs of the plurality of adder delay line components, and a plurality of fall delay line components operatively coupled to the outputs of the plurality of adder delay line components. As shown, operations 810 through 816 can be performed as part of operation 806.

At operation 810, the read data strobe path generates, by a base delay line component of the read data strobe path, a first delayed data strobe signal based on a first data strobe signal and a base delay line code of the base delay line component. The first data strobe signal can be generated based on a read data strobe signal (e.g., RDQS signal) received by the read data strobe path from the memory device. As noted herein, the read data strobe signal can serve as a clock signal for sampling of data signals on the one or more data paths carrying data bits read from the memory device.

For operation 812, the read data strobe path generates, by an individual adder delay line component of the read data strobe path, a second delayed data strobe signal based on a second data strobe signal received by the individual adder delay line component and based on an adder delay line code of the individual adder delay line component. For some embodiments, the individual adder delay line component is operatively coupled to an output of the base delay line component. Additionally, for some embodiments, the second data strobe signal is generated based on the first delayed data strobe signal generated by operation 810.

At operation 814, the read data strobe path generates, by an individual rise delay line component of the read data strobe path, a third delayed data strobe signal based on a third data strobe signal received by the individual rise delay line component and based on a rise delay line code of the individual rise delay line component. The third delayed data strobe signal can represent a rising-edge data strobe data signal that the individual rise delay line component outputs for sampling data bits from a data signal provided by a data path in the set of data paths that corresponds to the individual rise delay line component. For some embodiments, the individual rise delay line component is operatively coupled to an output of the individual adder delay line component. Additionally, for some embodiments, the third data strobe signal is generated based on the second delayed data strobe signal from the individual adder delay line component, which generated the second delayed data strobe signal during operation 812.

With respect to operation 816, the read data strobe path generates, by an individual fall delay line component of the read data strobe path, a fourth delayed data strobe signal based on a fourth data strobe signal received by the individual fall delay line component and based on a fall delay line code of the individual fall delay line component. The fourth delayed data strobe signal can represent a falling-edge data strobe data signal that the individual fall delay line component outputs for sampling data bits from a data signal provided by a data path in the set of data paths that corresponds to the individual fall delay line component. For some embodiments, the individual fall delay line component is operatively coupled to an output of the individual adder delay line component. Additionally, for some embodiments, the fourth data strobe signal is generated based on the second delayed data strobe signal from the individual adder delay line component, which generated the second delayed data strobe signal during operation 812.

Referring now to FIG. 9, the method 900 illustrates an example of using a first and a second master delay loop (MDL), in accordance with various embodiments. At operation 902, a first master delay loop sub-circuit generates, by a first master delay line component of the first master delay loop sub-circuit, a first delayed clock signal based on a clock signal received by the first master delay line component and based on a first master delay line code of the first master delay line component. At operation 904, the first master delay loop sub-circuit determines, by a first phase detector of the first master delay loop sub-circuit, a first phase difference between the clock signal (as received by the first phase detector) and the first delayed clock signal from the first master delay line component, which generates the first delayed clock signal during operation 902. Accordingly, for some embodiments, the first phase detector is operatively coupled to an output of the first master delay line component.

For operation 906, a first code update to the first master delay line code is applied based on the first phase difference. Depending on the embodiment, the first code update can be determined and applied by the first master delay loop sub-circuit or a microcontroller that is separate from the first master delay loop sub-circuit. By updating the first master delay line code based on the first phase difference, the first master delay loop sub-circuit effectively implements a feedback loop. As noted herein, the first master delay line code as updated can be used to determine compensation for VT drift in delay elements of the read data strobe path.

During operation 908, a second master delay loop sub-circuit generates, by a second master delay line component of the second master delay loop sub-circuit, a second delayed clock signal based on the clock signal received by the first master delay line component and a second master delay line code of the second master delay line component. At operation 910, the second master delay loop sub-circuit generates, by a network of components of the second master delay loop sub-circuit, a third delayed clock signal based on the second delayed clock signal from the second master delay line component (generated during operation 908). For some embodiments, the network of components is operatively coupled to an output of the second master delay line component. In various embodiments, the network of components is configured to model one or more logic blocks and logic gates (e.g., combinatorial logic) of the read data strobe path that are not included by an individual data path of the set of data paths. For operation 912, the second master delay loop sub-circuit determines, by a second phase detector of the second master delay loop sub-circuit, a second phase difference between the clock signal (as received by the second phase detector) and the third delayed clock signal from the network of components, which generates the third delayed clock signal during operation 910. Accordingly, for some embodiments, the second phase detector is operatively coupled to an output of the network of components.

For operation 914, a second code update to the second master delay line code is applied based on the second phase difference. Depending on the embodiment, the second code update can be determined and applied by the second master delay loop sub-circuit or a microcontroller that is separate from the second master delay loop sub-circuit. By updating the second master delay line code based on the second phase difference, the second master delay loop sub-circuit effectively implements a feedback loop. As noted herein, the second master delay line code as updated can be used to determine compensation for VT drift in logic blocks and logic gates of the read data strobe path.

Eventually, at operation 916, based on the first master delay line code and the second master delay line code, a microcontroller can determine one or more code updates for the base delay line code, adder delay line codes of adder delay line components, rise delay line codes of rise delay line components, and fall delay line codes of fall delay line components of the read data strobe path. For some embodiments, operation 916 comprises determining, based on the first code update, a first set of code updates for the adder delay line codes of the plurality of adder delay line components, for the rise delay line codes of the plurality of rise delay line components, and for the fall delay line codes of the plurality of fall delay line components, and determining, based on the first code update and the second code update, a third code update to the base delay line code. Depending on the embodiment, operation 916 can use one or more equations of Table 1 and Table 2 to determine one or more code updates for the base delay line code, the adder delay line components, the rise delay line components, and the fall delay line components.

Referring now to FIG. 10, the method 1000 illustrates an example of initially training codes of delay line components of a read data strobe path, in accordance with various embodiments. For some embodiments, the method 1000 illustrates an example of an initial training process performed by operation 802 of the method 800. Depending on the embodiment, a microcontroller (e.g., implementing a full state machine) can be used to perform the operations of method 1000.

At operation 1002, a microcontroller sweeps a base delay line code of a base delay line component (of a read data strobe path) through a range of different possible values while delay line codes of all other delay line components in the read data strobe path are set to a value (e.g., code zero) corresponding to application of zero delay. For instance, while the base delay line code of the base delay line component is swept through the range, the code of all adder delay line components, rise delay line components, and fall delay line components can be set to a value of 0.

During the sweeping performed by operation 1002, at operation 1004, the microcontroller determines a plurality of value pairs the base delay line code, where each individual value pair of the plurality of value pairs corresponds to a different delayed data strobe signal outputted by the plurality of rise delay line components and the plurality of fall delay line components. For example, during operation 1004, the microcontroller can record base delay line codes which causes sampling of leading and trailing edges of all data bits. For instance, the base delay line code recorded for the leading edge of a rise strobe signal for data bit position X can be code $L_{RX}$, the base delay line code recorded for the trailing edge of the rise strobe signal for data bit position X can be code $T_{RX}$, the leading edge of a fall strobe signal for data bit position X can be code $L_{FX}$, and the base delay line code recorded for the trailing edge of the fall strobe signal for data bit position X can be code $T_{FX}$. In this way, $L_{RX}$ and $T_{RX}$ can form a value pair for the base delay line code in association with a rise strobe signal for a data path, and $L_{FX}$ and $T_{FX}$ can form a value pair for the base delay line code in association with a fall strobe signal for the same data path. Accordingly, for nine data bit positions (e.g., eight DQ paths and a DMI path), the microcontroller can record the following codes: $(L_{R0}, T_{R0}, L_{F0}, T_{F0})$ through $(L_{R8}, T_{R8}, L_{F8}, T_{F8})$ for data bit positions 0 through 8. Accordingly, $L_{R0}$ can be the leading-edge code for a data signal provided by DQ<0> path sampled using read data strobe signal RDQS_R0, and $L_{F0}$ can be the leading-edge code for the data signal provided by DQ<0> path sampled using read data strobe signal RDQS_F0, $T_{R0}$ can be the trailing-edge code the data signal provided by DQ<0> path sampled using read data strobe signal RDQS_R0, and $T_{F0}$ can be the trailing-edge code for the data signal provided by DQ<0> path sampled using read data strobe signal RDQS_F0. The recording of codes can occur in parallel.

At operation 1006, the microcontroller determines, based on the plurality of value pairs, a plurality of average values corresponding to the plurality of value pairs. For example, the microcontroller can determine (e.g., compute) the base delay line code to be $D_{R0}$=average code value of $(L_{R0}, T_{R0})$ for obtaining the optimal capturing position for a data signal provided by DQ<0> path using read data strobe signal RDQS_R0. Similar operations can be performed for determining optimal capturing codes $D_{R1}, D_{R2}, \ldots D_{R7}$ corresponding to DQ<1> path, DQ<2> path, . . . . DQ<7> path using corresponding read data strobe signals RDQS_R1, RDQS_R2, . . . . RDQS_R7. Likewise, the microcontroller can determine (e.g., compute) the base delay line codes for the rise data strobe signals. For example, the microcontroller can determine the base delay line code to be $D_{F0}$=average code value of $(L_{F0}, T_{F0})$ for obtaining the optimal capturing position for a data signal provided by DQ<0> path using read data strobe signal RDQS_F0. Similar operations can be performed for determining optimal capturing codes DF1, DF2, . . . . DF7 corresponding to DQ<1> path, DQ<2> path, DQ<7> path using corresponding read data strobe signals RDQS_F1, RDQS_F2, . . . . RDQS_F7.

Thereafter, operations 1008 through 1014 determine the initial values for delay line components of the read data strobe path based on the plurality of average values determined by operation 1006. In particular, at operation 1008, the microcontroller determines a minimum value in the plurality of average values, the minimum value being set as an initial value for the base delay line code. For instance, the microcontroller determines a base delay line code $D_{TRAIN}$=min $(D_{R0}, D_{R1}, \ldots . D_{R8}, D_{F0}, D_{F1}, \ldots . D_{F8})$.

At operation 1010, the microcontroller determines, based on the plurality of average values and at least a portion of the plurality of value pairs, initial values for adder delay line codes of the plurality of adder delay line components. For instance, the microcontroller determines codes for each of the adder delay line components 0 through N as follows: $A_{TRAIN\_N}$=min$[(D_{RN}-D_{TRAIN}), (D_{FN}-D_{TRAIN})]$, where adder delay line component N corresponds to a data path N.

During operation 1012, the microcontroller determines, based on at least a portion of the plurality of value pairs, initial values for rise delay line codes of the plurality of rise delay line components. For instance, the microcontroller determines codes for each of rise delay line components 0 through N as follows: $R_{TRAIN\_N}=D_{RN}-D_{FN}$ if $D_{RN} \geq D_{FN}$ else 0, where rise delay line component N corresponds to a data path N.

For operation 1014, the microcontroller determines, based on at least a portion of the plurality of value pairs, initial values for fall delay line codes of the plurality of fall delay line components. For instance, the microcontroller determines codes for each of fall delay line components 0 through N as follows: $F_{TRAIN\_N}=D_{FN}-D_{RN}$ if $D_{RN} \leq D_{FN}$ else 0, where rise delay line component N corresponds to a data path N.

Figure 11:
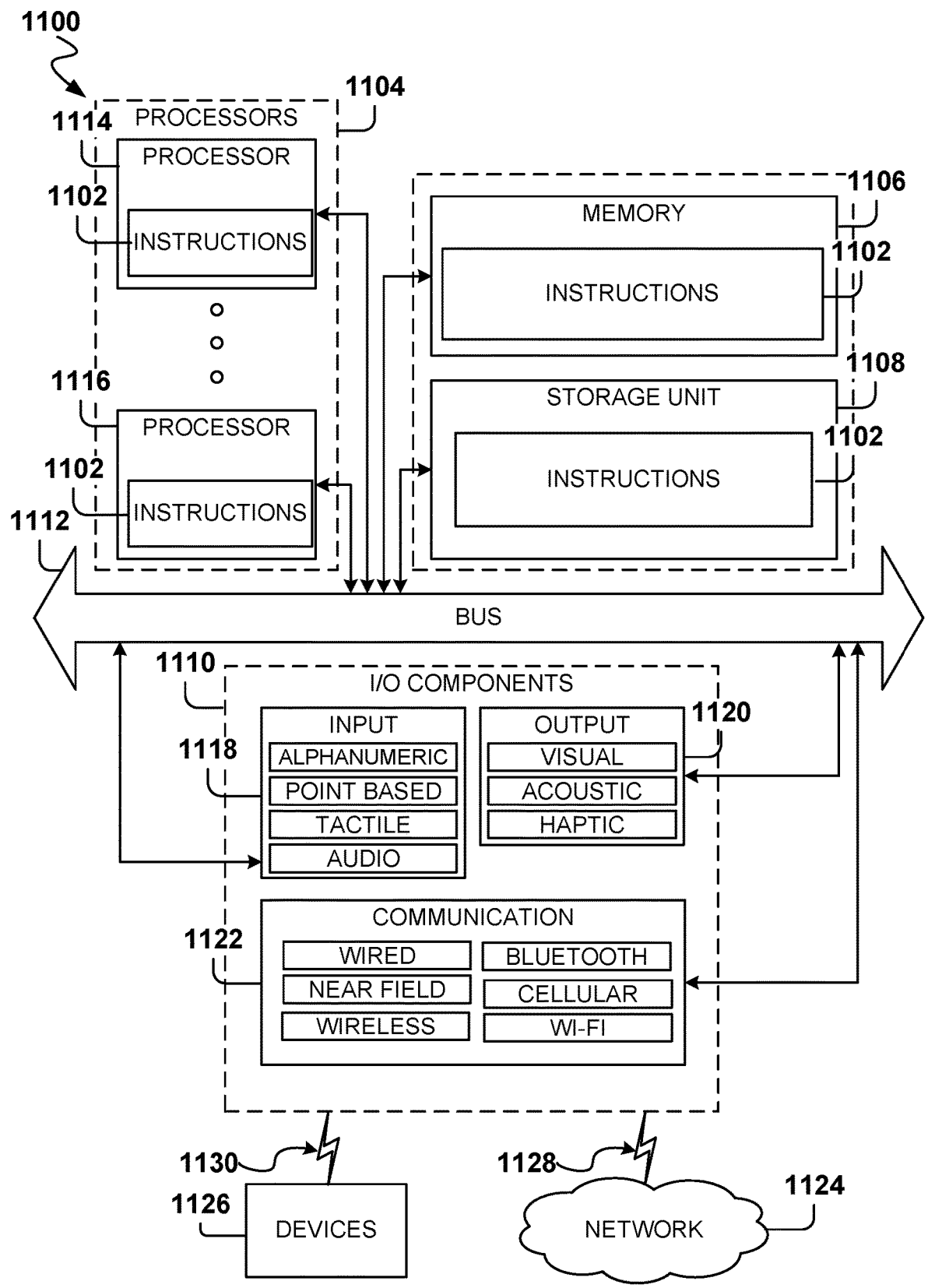
FIG. 11 is a block diagram illustrating components of a machine, according to some example embodiments, able to read instructions from a machine-readable medium and perform any one or more of the methodologies discussed herein.

FIG. 11 is a block diagram illustrating components of a machine 1100, according to some example embodiments, able to read instructions from a machine-readable medium (e.g., a machine-readable storage medium) and perform any one or more of the methodologies discussed herein. Specifically, FIG. 11 shows a diagrammatic representation of the machine 1100 in the example form of a system, within which instructions 1102 (e.g., software, a program, an application, an applet, an app, a driver, or other executable code) for causing the machine 1100 to perform any one or more of the methodologies discussed herein may be executed. For example, the instructions 1102 include executable code that causes the machine 1100 to execute one of the methods 800, 900, 1000. In this way, these instructions 1102 transform the general, non-programmed machine 1100 into a particular machine programmed to carry out the described and one of the illustrated methods 800, 900, 1000 in the manner described herein. The machine 1100 may operate as a standalone device or may be coupled (e.g., networked) to other machines.

By way of non-limiting example, the machine 1100 may comprise or correspond to a computer (e.g., a server computer, a client computer, a personal computer (PC), a tablet computer, a laptop computer, or a netbook), a smart phone, a mobile device, or any machine capable of executing the instructions 1102, sequentially or otherwise, that specify actions to be taken by the machine 1100. Further, while only a single machine 1100 is illustrated, the term "machine" shall also be taken to include a collection of machines 1100 that individually or jointly execute the instructions 1102 to perform any one or more of the methodologies discussed herein.

The machine 1100 may include processors 1104, memory 1106, a storage unit 1108, and I/O components 1110, which may be configured to communicate with each other such as via a bus 1112. In an example embodiment, the processors 1104 (e.g., a central processing unit (CPU), a reduced instruction set computing (RISC) processor, a complex instruction set computing (CISC) processor, a graphics processing unit (GPU), a digital signal processor (DSP), an application specific integrated circuit (ASIC), a radio-frequency integrated circuit (RFIC), another processor, or any suitable combination thereof) may include, for example, a processor 1114 and a processor 1116 that may execute the instructions 1102. The term "processor" is intended to include multi-core processors 1104 that may comprise two or more independent processors (sometimes referred to as "cores") that may execute instructions 1102 contemporaneously. Although FIG. 11 shows multiple processors 1104, the machine 1100 may include a single processor with a single core, a single processor with multiple cores (e.g., a multi-core processor), multiple processors with a single core, multiple processors with multiple cores, or any combination thereof.

The memory 1106 (e.g., a main memory or other memory storage) and the storage unit 1108 are both accessible to the processors 1104 such as via the bus 1112. The memory 1106 and the storage unit 1108 store the instructions 1102 embodying any one or more of the methodologies or functions described herein. The instructions 1102 may also reside, completely or partially, within the memory 1106, within the storage unit 1108, within at least one of the processors 1104 (e.g., within the processor's cache memory), or any suitable combination thereof, during execution thereof by the machine 1100. Accordingly, the memory 1106, the storage unit 1108, and the memory of the processors 1104 are examples of machine-readable media.

As used herein, "machine-readable medium" means a device able to store instructions and data temporarily or permanently and may include, but is not limited to, random-access memory (RAM), read-only memory (ROM), buffer memory, flash memory, optical media, magnetic media, cache memory, other types of storage (e.g., erasable programmable read-only memory (EEPROM)), and/or any suitable combination thereof. The term "machine-readable medium" should be taken to include a single medium or multiple media (e.g., a centralized or distributed database, or associated caches and servers) able to store the instructions 1102. The term "machine-readable medium" shall also be taken to include any medium, or combination of multiple media, that is capable of storing instructions (e.g., instructions 1102) for execution by a machine (e.g., machine 1100), such that the instructions, when executed by one or more processors of the machine (e.g., processors 1104), cause the machine to perform any one or more of the methodologies described herein (e.g., methods 800, 900, 1000). Accordingly, a "machine-readable medium" refers to a single storage apparatus or device, as well as "cloud-based" storage systems or storage networks that include multiple storage apparatus or devices. The term "machine-readable medium" excludes signals per se.

Furthermore, the "machine-readable medium" is non-transitory in that it does not embody a propagating signal. However, labeling the tangible machine-readable medium as "non-transitory" should not be construed to mean that the medium is incapable of movement—the medium should be considered as being transportable from one real-world location to another. Additionally, since the machine-readable medium is tangible, the medium may be considered to be a machine-readable device.

The I/O components 1110 may include a wide variety of components to receive input, provide output, produce output, transmit information, exchange information, capture measurements, and so on. The specific I/O components 1110 that are included in a particular machine 1100 will depend on the type of the machine 1100. For example, portable machines such as mobile phones will likely include a touch input device or other such input mechanisms, while a headless server machine will likely not include such a touch input device. It will be appreciated that the I/O components 1110 may include many other components that are not specifically shown in FIG. 11. The I/O components 1110 are grouped according to functionality merely for simplifying the following discussion and the grouping is in no way limiting. In various example embodiments, the I/O components 1110 may include input components 1118 and output components 1120. The input components 1118 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components, and the like. The output components 1120 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth.

Communication may be implemented using a wide variety of technologies. The I/O components 1110 may include communication components 1122 operable to couple the machine 1100 to a network 1124 or devices 1126 via a coupling 1128 and a coupling 1130 respectively. For example, the communication components 1122 may include a network interface component or another suitable device to interface with the network 1124. In further examples, the communication components 1122 may include wired communication components, wireless communication components, cellular communication components, near field communication (NFC) components, Bluetooth® components (e.g., Bluetooth® Low Energy), Wi-Fi® components, and other communication components to provide communication via other modalities. The devices 1126 may be another machine or any of a wide variety of peripheral devices.

Modules, Components and Logic

Certain embodiments are described herein as including logic or a number of components, modules, or mechanisms. Modules may constitute either software modules (e.g., code embodied on a machine-readable medium or in a transmission signal) or hardware modules. A hardware module is a tangible unit capable of performing certain operations and may be configured or arranged in a certain manner. In example embodiments, one or more computer systems (e.g., a standalone, client, or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field-programmable gate array (FPGA) or an ASIC) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner and/or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses that connect the hardware modules). In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., APIs).

Electronic Apparatus and System

Embodiments may be implemented in digital electronic circuitry, in computer hardware, firmware, or software, or in combinations of them. Embodiments may be implemented using a computer program product, for example, a computer program tangibly embodied in an information carrier, for example, in a machine-readable medium for execution by, or to control the operation of, data processing apparatus, for example, a programmable processor, a computer, or multiple computers.

A computer program can be written in any form of programming language, including compiled or interpreted languages, and it can be deployed in any form, including as a standalone program or as a module, subroutine, or other unit suitable for use in a computing environment. A computer program can be deployed to be executed on one computer or on multiple computers at one site, or distributed across multiple sites and interconnected by a communication network.

In example embodiments, operations may be performed by one or more programmable processors executing a computer program to perform functions by operating on input data and generating output. Method operations can also be performed by, and apparatus of example embodiments may be implemented as, special purpose logic circuitry (e.g., an FPGA or an ASIC).

The computing system can include clients and servers. A client and server are generally remote from each other and typically interact through a communication network. The relationship of client and server arises by virtue of computer programs running on the respective computers and having a client-server relationship to each other. In embodiments deploying a programmable computing system, it will be appreciated that both hardware and software architectures merit consideration. Specifically, it will be appreciated that the choice of whether to implement certain functionality in permanently configured hardware (e.g., an ASIC), in temporarily configured hardware (e.g., a combination of software and a programmable processor), or in a combination of permanently and temporarily configured hardware may be a design choice.

Figure 12:
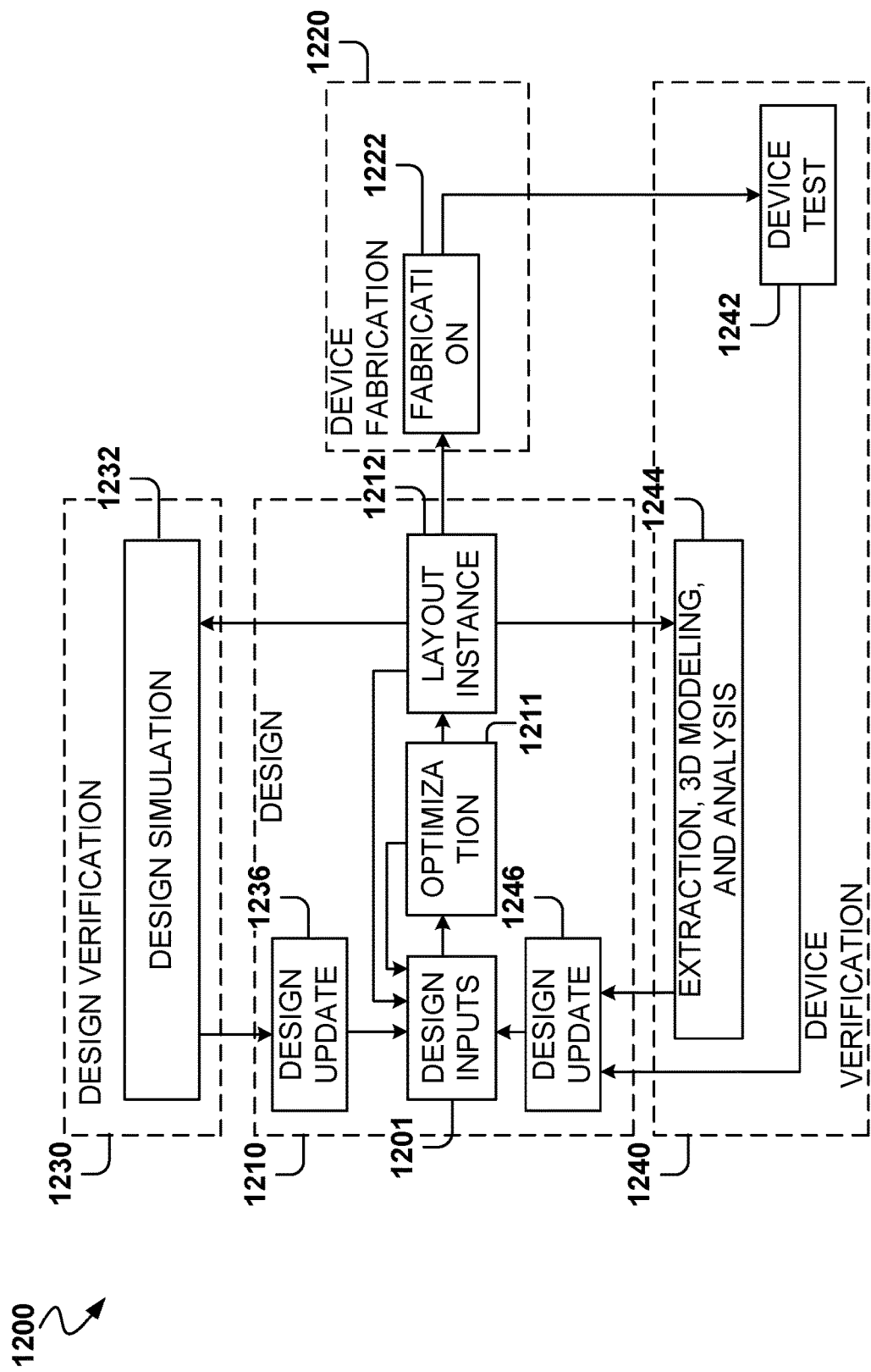
FIG. 12 is a diagram illustrating one possible design process flow for generating a circuit, including embodiments to implement a read data strobe path from a memory device as described herein, and in various embodiments, to integrate the read data strobe path with a larger integrated circuit comprising different design blocks.

FIG. 12 is a diagram illustrating one possible design process flow for generating a circuit, including embodiments to implement a read data strobe path from a memory device as described herein, and in various embodiments, to integrate the read data strobe path with a larger integrated circuit comprising different design blocks. As illustrated, the overall design flow 1200 includes a design phase 1210, a device fabrication phase 1220, a design verification phase 1230, and a device verification phase 1240. The design phase 1210 involves an initial design input operation 1201 where the basic elements and functionality of a device are determined, as well as revisions based on various analyses and optimization of a circuit design. This design input operation 1201 is where instances of an EDA circuit design file are used in the design and any additional circuitry is selected. The initial strategy, tactics, and context for the device to be created are also generated in the design input operation 1201, depending on the particular design algorithm to be used.

In some embodiments, following an initial selection of design values in the design input operation 1201, timing analysis and optimization according to various embodiments occurs in an optimization operation 1211, along with any other automated design processes. One such process may be the automated design of a partitioned root search for error locator polynomial functions in RS FEC decoding. As described below, design constraints for blocks of a circuit design generated with design inputs in the design input operation 1201 may be analyzed using hierarchical timing analysis, according to various embodiments. While the design flow 1200 shows such optimization occurring prior to a layout instance 1212, such hierarchical timing analysis and optimization may be performed at any time to verify operation of a circuit design. For example, in various embodiments, constraints for blocks in a circuit design may be generated prior to routing of connections in the circuit design, after routing, during register transfer level (RTL) operations, or as part of a final signoff optimization or verification prior to a device fabrication operation 1222.

After design inputs are used in the design input operation 1201 to generate a circuit layout, and any optimization operations 1211 are performed, a layout is generated in the layout instance 1212. The layout describes the physical layout dimensions of the device that match the design inputs. This layout may then be used in the device fabrication operation 1222 to generate a device, or additional testing and design updates may be performed using designer inputs or automated updates based on design simulation 1232 operations or extraction, 3D modeling, and analysis 1244 operations. Once the device is generated, the device can be tested as part of device test 1242 operations, and layout modifications generated based on actual device performance.

As described in more detail below, design updates 1236 from the design simulation 1232, design updates 1246 from the device test 1242, the 3D modeling and analysis 1244 operations, or the design input operation 1201 may occur after an initial layout instance 1212 is generated. In various embodiments, whenever design inputs are used to update or change an aspect of a circuit design, a timing analysis and optimization operation 1211 may be performed.

For example, in various embodiments, a user may provide an input to a computing device indicating placement of elements of a circuit within a first portion of a circuit design, including description of circuitry for a read data strobe path from a memory device described herein. An output to a display of the computing device may show details of a circuit design, and may further be used to generate results of the timing analysis, or may show recommended optimizations or automatically performed adjustments to the circuit design based on the timing analysis. Further inputs to the computing device may involve adjustments as user design inputs, with additional timing analysis and optimization initiated via user operation of the computing device. In some embodiments, a computing device may be used to generate circuit design files describing circuitry corresponding to embodiments described herein. Such circuit design files may be used as outputs to generate photolithographic masks or other control files and components used to generate circuits that operate in accordance with various embodiments described herein.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, components, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A circuit comprising:
   a set of data paths operatively coupled to a Double Data Rate (DDR) Dynamic Random-Access Memory (DRAM) memory device and configured to provide data signals that carry data bits read from the DDR DRAM memory device; and
   a read data strobe (RDQS) path operatively coupled to the DDR DRAM memory device and configured to provide data strobe signals for sampling the data bits from the data signals provided by the set of data paths, the RDQS path comprising a plurality of delay line components configured to adjust the RDQS signal at a center of the data bits carried by the data signals, the plurality of delay line components comprising:
      a first digital delay line component operatively coupled to an output of the DDR DRAM memory device that provides a RDQS signal, the first digital delay line component being configured to provide skew between the data signals and the RDQS signal;
      a plurality of second digital delay line components operatively coupled to an output of the first digital delay line component, an individual second digital delay line component of the plurality of second digital delay line components being configured to provide de-skewing between an output signal provided by the first digital delay line component and a data signal provided by an individual data path in the set of data paths that corresponds to the individual second digital delay line component;
      a plurality of third digital delay line components operatively coupled to outputs of the plurality of second digital delay line components, an individual third digital delay line component of the plurality of third digital delay line components being configured to output a rising-edge RDQS signal for sampling data bits from the data signal provided by the individual data path; and
      a plurality of fourth digital delay line components operatively coupled to the outputs of the plurality of second digital delay line components, an individual fourth digital delay line component of the plurality of fourth digital delay line components being configured to output a falling-edge RDQS signal for sampling data bits from the data signal provided by the individual data path, the individual third digital delay line component and the individual fourth digital delay line component create offset between the rising-edge RDQS signal and the falling-edge RDQS signal to compensate for duty cycle distortion by creating offset.

2. The circuit of claim 1, wherein:
   the first digital delay line component is configured to generate a first delayed data strobe signal based on a first data strobe signal and a first digital delay line code of the first digital delay line component, the first digital delay line code, the first data strobe signal being generated based on the RDQS signal received by the RDQS path from the DDR DRAM memory device;
   the individual second digital delay line component of the plurality of second digital delay line components is configured to a second delayed data strobe signal based on a second data strobe signal and an second digital delay line code of the individual second digital delay line component, the second data strobe signal being generated based on the first delayed data strobe signal;
   the individual third digital delay line component is configured to generate a third delayed data strobe signal based on a third data strobe signal and a third digital delay line code of the individual third digital delay line component, the third data strobe signal being generated based on at least one of the second delayed data strobe signals generated by the plurality of second digital delay line components, the rising-edge RDQS signal comprising the third delayed data strobe signal; and
   the individual fourth digital delay line component is configured to generate a fourth delayed data strobe signal based on a fourth data strobe signal and a fourth digital delay line code of the individual fourth digital delay line component, the fourth data strobe signal being generated based on at least one of the second delayed data strobe signals generated by the plurality of second digital delay line components, the falling-edge RDQS signal comprising the fourth delayed data strobe signal.

3. The circuit of claim 2, comprising:
   a first master delay loop sub-circuit comprising:

a fifth digital delay line component configured to generate a first delayed clock signal based on a clock signal and a fifth digital delay line code of the fifth digital delay line component; and a first phase detector operatively coupled to an output of the fifth digital delay line component, the first phase detector being configured to determine a first phase difference between the clock signal and the first delayed clock signal, the fifth digital delay loop sub-circuit being configured to apply a first code update to the fifth digital delay line code based on the first phase difference;

a second master delay loop sub-circuit comprising:
a sixth digital delay line component configured to generate a second delayed clock signal based on the clock signal and a sixth digital delay line code of the sixth digital delay line component;

a network of components configured to model one or more logic blocks and logic gates of the RDQS path that are not included by the individual data path of the set of data paths, the network of components operatively coupled to an output of the sixth digital delay line component, the network of components being configured to generate a third delayed clock signal based on the second delayed clock signal; and a second phase detector operatively coupled to an output of the network of components, the second phase detector being configured to determine a second phase difference between the clock signal and the third delayed clock signal, the second master delay loop sub-circuit being configured to apply a second code update to the sixth digital delay line code based on the second phase difference; and a microcontroller configured to determine code updates for the first digital delay line code, second digital delay line codes of the plurality of second digital delay line components, third digital delay line codes of the plurality of third digital delay line components, and fourth digital delay line codes of the plurality of fourth digital delay line components based on the fifth digital delay line code and the sixth digital delay line code.

4. The circuit of claim 3, wherein the determining of the code updates comprises:
determining, based on the first code update, a first set of code updates for the second digital delay line codes of the plurality of second digital delay line components, for the third digital delay line codes of the plurality of third digital delay line components, and for the fourth digital delay line codes of the plurality of fourth digital delay line components; and
determining, based on the first code update and the second code update, a third code update to the first digital delay line code.

5. The circuit of claim 3, wherein the microcontroller is configured to:
perform an initial training process on digital delay line components of the RDQS path prior to the determining of the code updates based on the fifth digital delay line code and the sixth digital delay line code.

6. The circuit of claim 2, comprising:
a first master delay loop sub-circuit comprising:
a fifth digital delay line component configured to generate a first delayed clock signal based on a clock signal and a fifth digital delay line code of the fifth digital delay line component; and
a first phase detector operatively coupled to an output of the fifth digital delay line component, the first phase detector being configured to determine a first phase difference between the clock signal and the first delayed clock signal, the fifth digital delay loop sub-circuit being configured to apply a first code update to the fifth digital delay line code based on the first phase difference;

a second master delay loop sub-circuit comprising:
a frequency divider configured to generate a frequency divided clock signal generated based on the clock signal and a selection input value of the frequency divider;
a sixth digital delay line component configured to generate a second delayed clock signal based on the frequency divided clock signal and a sixth digital delay line code of the sixth digital delay line component;
a network of components configured to model one or more logic blocks and logic gates of the RDQS path that are not included by the individual data path of the set of data paths, the network of components operatively coupled to an output of the sixth digital delay line component, the network of components being configured to generate a third delayed clock signal based on the second delayed clock signal; and
a second phase detector operatively coupled to an output of the network of components, the second phase detector being configured to determine a second phase difference between the clock signal and the third delayed clock signal, the second master delay loop sub-circuit being configured to apply a second code update to the sixth digital delay line code based on the second phase difference; and a microcontroller configured to determine code updates for the first digital delay line code, second digital delay line codes of the plurality of second digital delay line components, third digital delay line codes of the plurality of third digital delay line components, and fourth digital delay line codes of the plurality of fourth digital delay line components based on the fifth digital delay line code and the sixth digital delay line code.

7. The circuit of claim 2, comprising:
a microcontroller configured to:
perform an initial training process on digital delay line components of the RDQS path, the initial training process comprising:
sweeping the first digital delay line code of the first digital delay line component through a range of different possible values while delay line codes of all other digital delay line components in the RDQS path are set to a value corresponding to zero delay;
during the sweeping of the first digital delay line code through the range of different possible values, determining a plurality of value pairs for the first digital delay line code, each individual value pair of the plurality of value pairs corresponding to a different delayed data strobe signal outputted by the plurality of third digital delay line components and the plurality of fourth digital delay line components;
determining, based on the plurality of value pairs, a plurality of average values corresponding to the plurality of value pairs; and
determining a minimum value in the plurality of average values, the minimum value being set as an initial value for the first digital delay line code.

8. The circuit of claim 7, wherein the initial training process comprises:

determining, based on the plurality of average values and at least a portion of the plurality of value pairs, initial values for second digital delay line codes of the plurality of second digital delay line components.

9. The circuit of claim 7, wherein the initial training process comprises:
determining, based on at least a portion of the plurality of value pairs, initial values for third digital delay line codes of the plurality of third digital delay line components.

10. The circuit of claim 7, wherein the initial training process comprises:
determining, based on at least a portion of the plurality of value pairs, initial values for fourth digital delay line codes of the plurality of fourth digital delay line components.

11. The circuit of claim 2, comprising:
a multi-modal master delay loop sub-circuit comprising:
 a frequency divider configured to generate a frequency divided clock signal generated based on the clock signal and a selection input value of the frequency divider;
 a first multiplexer comprises a first input to receive the frequency divided clock signal, a second input to receive the clock signal, and a selection input to receive a mode selection value, the first multiplexer being configured to output one of the frequency divided clock signal or the clock signal based on the mode selection value;
 a fifth digital delay line component configured to generate a first delayed clock signal based on an output of the first multiplexer and a fifth digital delay line code of the fifth digital delay line component;
 a network of components configured to model one or more logic blocks and logic gates of the RDQS path that are not included by the individual data path of the set of data paths, the network of components operatively coupled to an output of the fifth digital delay line component, the network of components being configured to generate a second delayed clock signal based on the first delayed clock signal;
 a second multiplexer comprises a first input to receive the second delayed clock signal, a second input to receive the first delayed clock signal, and a selection input to receive the mode selection value, the second multiplexer being configured to output one of the second delayed clock signal or the first delayed clock signal based on the mode selection value;
 a third multiplexer comprises a first input to receive the output of the first multiplexer, a second input to receive the output of the first multiplexer, and a selection input to receive the mode selection value, the second multiplexer being configured to output the output of the first multiplexer based on the mode selection value; and
 a phase detector operatively coupled to an output of the second multiplexer and to an output of the third multiplexer, the phase detector being configured to determine a phase difference between the output of the second multiplexer and to the output of the third multiplexer, the multi-mode master delay loop sub-circuit being configured to apply a code update to the fifth digital delay line code based on the phase difference; and
a microcontroller configured to determine code updates for the first digital delay line code, second digital delay line codes of the plurality of second digital delay line components, third digital delay line codes of the plurality of third digital delay line components, and fourth digital delay line codes of the plurality of fourth digital delay line components based on the fifth digital delay line code and based on the mode selection value.

12. A method comprising:
providing, by a set of data paths operatively coupled to a Double Data Rate (DDR) Dynamic Random-Access Memory (DRAM) memory device that stores data, data signals that carry data bits read from the DDR DRAM memory device; and
providing, by a read data strobe (RDQS) path operatively coupled to the DDR DRAM memory device, data strobe signals for sampling the data bits from the data signals provided by the set of data paths, the RDQS path comprising a plurality of delay line components configured to adjust the RDQS signal at a center of the data bits carried by the data signals, the plurality of delay line components comprising:
 a first digital delay line component operatively coupled to an output of the DDR DRAM memory device that provides a RDQS signal, the first digital delay line component being configured to provide skew between the data signals and the RDQS signal;
 a plurality of second digital delay line components operatively coupled to an output of the first digital delay line component, an individual second digital delay line component of the plurality of second digital delay line components being configured to provide de-skewing between an output signal provided by the first digital delay line component and a data signal provided by an individual data path in the set of data paths that corresponds to the individual second digital delay line component;
 a plurality of third digital delay line components operatively coupled to outputs of the plurality of second digital delay line components; and
 a plurality of fourth digital delay line components operatively coupled to the outputs of the plurality of second digital delay line components, the individual third digital delay line component and the individual fourth digital delay line component create offset between a rising-edge RDQS signal and a falling-edge RDQS signal to compensate for duty cycle distortion by creating offset.

13. The method of claim 12, wherein the providing of the data strobe signals comprises:
generating, by the first digital delay line component, a first delayed data strobe signal based on a first data strobe signal and a first digital delay line code of the first digital delay line component, the first data strobe signal being generated based on the RDQS signal received by the RDQS path from the DDR DRAM memory device;
generating, by the individual second digital delay line component of the plurality of second digital delay line components, a second delayed data strobe signal based on a second data strobe signal and an second digital delay line code of the individual second digital delay line component, the second data strobe signal being generated based on the first delayed data strobe signal;
generating, by an individual third digital delay line component of the plurality of third digital delay line components, a third delayed data strobe signal based on a third data strobe signal and a third digital delay line code of the individual third digital delay line component, the third data strobe signal being generated based on the second delayed data strobe signal from the individual second digital delay line component; and generating, by an individual fourth digital delay line component of the plurality of fourth digital delay line components, a fourth delayed data strobe signal based on a fourth data strobe signal and a fourth digital delay line code of the individual fourth digital delay line component, the fourth data strobe signal being generated based on the second delayed data strobe signal from the individual second digital delay line component, the individual third digital delay line component and the individual fourth digital delay line component create offset between the rising-edge RDQS signal and the falling-edge RDQS signal to compensate for duty cycle distortion by creating offset.

14. The method of claim 13, comprising:
generating, by a fifth digital delay line component of a first master delay loop sub-circuit, a first delayed clock signal based on a clock signal and a fifth digital delay line code of the fifth digital delay line component;
determining, by a first phase detector of the first master delay loop sub-circuit, a first phase difference between the clock signal and the first delayed clock signal, the first phase detector being operatively coupled to an output of the fifth digital delay line component;
applying a first code update to the fifth digital delay line code based on the first phase difference;
generating, by a sixth delay line component of a second master delay loop sub-circuit, a second delayed clock signal based on the clock signal and a sixth digital delay line code of the sixth digital delay line component;
generating, by a network of components of the second master delay loop sub-circuit, a third delayed clock signal based on the second delayed clock signal, the network of components being configured to model one or more logic blocks and logic gates of the RDQS path that are not included by the individual data path of the set of data paths, the network of components operatively coupled to an output of the sixth digital delay line component;
determining, by a second phase detector of the second master delay loop sub-circuit, a second phase difference between the clock signal and the third delayed clock signal, the second phase detector being operatively coupled to an output of the network of components;
applying a second code update to the sixth digital delay line code based on the second phase difference; and
determining, by a microcontroller, a set of code updates for the first digital delay line code, second digital delay line codes of the plurality of second digital delay line components, third digital delay line codes of the plurality of third digital delay line components, and fourth digital delay line codes of the plurality of fourth digital delay line components based on the fifth digital delay line code and the sixth digital delay line code.

15. The method of claim 14, wherein the determining of the set of code updates comprises:
determining, based on the first code update, a first set of code updates for the second digital delay line codes of the plurality of second digital delay line components, for the third digital delay line codes of the plurality of third digital delay line components, and for the fourth digital delay line codes of the plurality of fourth digital delay line components; and determining, based on the first code update and the second code update, a third code update to the base delay line code.

16. The method of claim 14, comprising:
performing, by the microcontroller, an initial training process on digital delay line components of the RDQS path prior to the determining of the set of code updates based on the fifth digital delay line code and the sixth digital delay line code.

17. The method of claim 13, comprising:
performing, by a microcontroller, an initial training process on digital delay line components of the RDQS path, the initial training process comprising:
sweeping the first digital delay line code of the first digital delay line component through a range of different possible values while delay line codes of all other digital delay line components in the RDQS path are set to a value corresponding to zero delay;
during the sweeping of the first digital delay line code through the range of different possible values, determining a plurality of value pairs for the first digital delay line code, each individual value pair of the plurality of value pairs corresponding to a different delayed data strobe signal outputted by the plurality of third digital delay line components and the plurality of fourth digital delay line components;
determining, based on the plurality of value pairs, a plurality of average values corresponding to the plurality of value pairs; and
determining a minimum value in the plurality of average values, the minimum value being set as an initial value for the first digital delay line code.

18. The method of claim 17, wherein the initial training process comprises:
determining, based on the plurality of average values and at least a portion of the plurality of value pairs, initial values for second digital delay line codes of the plurality of second digital delay line components.

19. The method of claim 17, wherein the initial training process comprises:
determining, based on at least a portion of the plurality of value pairs, initial values for third digital delay line codes of the plurality of third digital delay line components; and
determining, based on at least a portion of the plurality of value pairs, initial values for fourth digital delay line codes of the plurality of fourth digital delay line components.

20. A non-transitory computer-readable medium comprising instructions that, when executed by one or more processors of a computing device, cause the computing device to generate a circuit design by performing operations comprising:
configuring, in the circuit design, a Double Data Rate (DDR) Dynamic Random-Access Memory (DRAM) memory device for storing data;
configuring, in the circuit design, a set of data paths operatively coupled to the DDR DRAM memory device and configured to provide data signals that carry data bits read from the DDR DRAM memory device; and
configuring, in the circuit design, a read data strobe (RDQS) path operatively coupled to the DDR DRAM memory device and configured to provide data strobe signals for sampling the data bits from the data signals provided by the set of data paths, the RDQS path comprising a plurality of delay line components configured to adjust the RDQS signal at a center of the data bits carried by the data signals, the plurality of delay line components comprising:

a first digital delay line component operatively coupled to an output of the DDR DRAM memory device that provides a RDQS signal, the first digital delay line component being configured to provide skew between the data signals and the RDQS signal;

a plurality of second digital delay line components operatively coupled to an output of the first digital delay line component, an individual second digital delay line component of the plurality of second digital delay line components being configured to provide de-skewing between an output signal provided by the first digital delay line component and a data signal provided by an individual data path in the set of data paths that corresponds to the individual second digital delay line component;

a plurality of third digital delay line components operatively coupled to outputs of the plurality of second digital delay line components, an individual third digital delay line component of the plurality of third digital delay line components being configured to output a rising-edge RDQS signal for sampling data bits from the data signal provided by the individual data path; and a plurality of fourth digital delay line components operatively coupled to the outputs of the plurality of second digital delay line components, an individual fourth digital delay line component of the plurality of fourth digital delay line components being configured to output a falling-edge RDQS signal for sampling data bits from the data signal provided by the individual data path, the individual third digital delay line component and the individual fourth digital delay line component create offset between the rising-edge RDQS signal and the falling-edge RDQS signal to compensate for duty cycle distortion by creating offset.

\* \* \* \* \*